(12) United States Patent
Paik et al.

(10) Patent No.: US 12,446,340 B2
(45) Date of Patent: Oct. 14, 2025

(54) SENSOR WITH UPCONVERSION LAYER

(71) Applicant: SRI International, Menlo Park, CA (US)

(72) Inventors: Namwoong Paik, Lawrenceville, NJ (US); Peter Alan Levine, West Windsor, NJ (US)

(73) Assignee: SRI International, Menlo Park, CA (US)

( * ) Notice: Subject to any disclaimer, the term of this patent is extended or adjusted under 35 U.S.C. 154(b) by 259 days.

(21) Appl. No.: 17/817,841

(22) Filed: Aug. 5, 2022

(65) Prior Publication Data

US 2023/0041955 A1 Feb. 9, 2023

Related U.S. Application Data

(60) Provisional application No. 63/229,965, filed on Aug. 5, 2021.

(51) Int. Cl.
| | | |
|---|---|---|
| *H01L 27/146* | (2006.01) | |
| *G02B 5/20* | (2006.01) | |
| *H10F 39/00* | (2025.01) | |
| *H10F 39/18* | (2025.01) | |

(52) U.S. Cl.
CPC ........... *H10F 39/805* (2025.01); *G02B 5/208* (2013.01); *H10F 39/024* (2025.01); *H10F 39/1847* (2025.01)

(58) Field of Classification Search
None
See application file for complete search history.

(56) References Cited

U.S. PATENT DOCUMENTS

| | | | |
|---|---|---|---|
| 8,654,232 B2 | 2/2014 | Evine et al. | |
| 2011/0013253 A1* | 1/2011 | Ji | G02B 5/008 |
| | | | 977/774 |
| 2011/0180714 A1* | 7/2011 | Okada | G01T 1/243 |
| | | | 250/354.1 |
| 2013/0063807 A1* | 3/2013 | Dam | G02F 1/3534 |
| | | | 359/326 |
| 2013/0126850 A1* | 5/2013 | Iwakiri | H10K 71/00 |
| | | | 257/53 |
| 2013/0278716 A1* | 10/2013 | Kennedy | H04N 13/20 |
| | | | 348/42 |
| 2015/0008390 A1* | 1/2015 | Lewis | H01L 31/12 |
| | | | 438/24 |

(Continued)

FOREIGN PATENT DOCUMENTS

WO    WO-2007044955 A2 *   4/2007   ............... C09D 5/22

*Primary Examiner* — Marcus H Taningco
(74) *Attorney, Agent, or Firm* — Shumaker & Sieffert, P.A.

(57) ABSTRACT

In general, the disclosure describes a sensor comprising a photo-sensitive silicon substrate configured to detect ultraviolet (UV), visible, and near-infrared (NIR) light and an upconversion layer comprising a plurality of crystals configured to convert short wave infrared light to UV, visible, or NIR light. An example sensor includes an upconversion layer comprising a plurality of crystals configured to convert electromagnetic radiation comprising a first range of wavelengths greater than 1100 nm to electromagnetic radiation comprising a second range of wavelengths less than or equal to 1100 nm and a photo-sensitive silicon substrate configured to detect the electromagnetic radiation comprising the second range of wavelengths.

20 Claims, 10 Drawing Sheets

(56) References Cited

U.S. PATENT DOCUMENTS

| | | | |
|---|---|---|---|
| 2016/0296692 A1* | 10/2016 | Agris, III | A61M 5/007 |
| 2017/0261622 A1* | 9/2017 | Tsuda | G01T 1/202 |
| 2018/0313501 A1* | 11/2018 | Anc | H01L 33/502 |
| 2018/0356625 A1* | 12/2018 | Conley | G02B 23/12 |
| 2019/0072976 A1* | 3/2019 | Bell | C09D 5/22 |
| 2020/0284883 A1* | 9/2020 | Ferreira | H04N 25/773 |
| 2020/0357841 A1* | 11/2020 | Meylan | H01L 31/0312 |
| 2021/0210544 A1* | 7/2021 | Fontcuberta Morral | H04N 5/33 |
| 2021/0376172 A1* | 12/2021 | Krishnamurthy | C09K 11/892 |
| 2022/0268697 A1 | 8/2022 | Burnsed et al. | |
| 2022/0291594 A1* | 9/2022 | Kremer | G01J 1/4257 |
| 2022/0381927 A1* | 12/2022 | Ota | G01T 1/2002 |

* cited by examiner

702 — DISPOSE AN UPCONVERSION LAYER ON A SURFACE OF A PHOTO-SENSITIVE SILICON SUBSTRATE

FIG. 8

802 — CONVERT LIGHT HAVING A FIRST RANGE OF WAVELENGTHS GREATER THAN 1100 NM TO LIGHT HAVING A SECOND RANGE OF WAVELENGTHS LESS OR EQUAL TO 1100 NM

804 — DETECT THE LIGHT HAVING THE SECOND RANGE OF WAVELENGTHS

FIG. 9

SENSOR WITH UPCONVERSION LAYER

This application claims the benefit of U.S. Provisional Patent Application 63/229,965, filed Aug. 5, 2021, the entire content of which is incorporated herein by reference.

TECHNICAL FIELD

This disclosure generally relates to imaging devices.

BACKGROUND

An image sensor may be a semiconductor device for converting an optical image into electric signals. The image sensor may include a photo-sensitive silicon element capable of detecting light in the ultraviolet (UV), visible, and/or near infrared (NIR, e.g., up to about 1100 nanometers (nm)) wavelength ranges. Image sensors configured to detect light having wavelengths greater than 1100 nm, e.g., short wave infrared (SWIR), mid-wave infrared (MWIR), and/or long wave infrared (LWIR) are typically expensive due to the need to use materials and/or techniques capable of detecting the lower energy light, e.g., indium gallium arsenide (InGaAs), mercury cadmium telluride (HgCdTe), germanium, lead sulfide (PbS), indium antimonide (InSb), indium arsenide (InAs), lead selenide, lithium tantalate (LiTaO3), platinum silicide (PtSi), microbolometers, photomultiplier tubes, and the like.

SUMMARY

In general, the disclosure describes a sensor having an upconversion layer that increases a frequency of electromagnetic radiation incident on the sensor to a wavelength range detectable by the photo-sensitive silicon substrate of the sensor. In some examples, the upconversion layer includes crystals having a dopant selected to absorb the incident electromagnetic radiation at a first range of wavelengths (e.g., greater than or equal to 1100 nm) and to emit electromagnetic radiation at a second range of wavelengths (e.g., less than 1100 nm). In this way, the sensor may be used to detect, in the normal case, both shorter wavelength light within the first range of wavelengths, e.g., UV, visible, and NIR light, as well as longer wavelength light within the second range of wavelengths that the photo-sensitive silicon substrate would not otherwise be capable of detecting. Additionally, the upconversion layer may provide scattering configured to increase the angle of incidence of electromagnetic radiation at the second range of wavelengths to increase the quantum efficiency of the sensor, e.g., via a longer mean path length within the photo-sensitive material (silicon). Additionally, the upconversion layer may provide a negative electric charge configured to stabilize the back surface of a photo-sensitive silicon substrate of a back side illuminated (BSI) sensor.

Accordingly, the techniques may provide one or more technical advantages that realize at least one practical application. For example, the techniques may improve the NIR quantum efficiency for increased night vision capability, e.g., for light having a wavelength range between 800 nm and 1050 nm, of sensors utilizing silicon as a photo-sensitive substrate, e.g., complementary metal-oxide semiconductor (CMOS) or charge coupled device (CCD) sensors. The techniques may also extend the wavelength range sensitivity of a silicon-based sensor, e.g., to the SWIR, MWIR, LWIR, or other electromagnetic wavelength ranges. For example, the techniques may extend the wavelength responsivity of relatively lower cost silicon-based sensors such as CMOS, CCD, and the like, to sense 1550 nm light used as eye safe laser light, light detection and ranging (LIDAR), laser designator light, or the like. In other words, the techniques may provide a lower cost, silicon-based sensor configured to sense electromagnetic radiation wavelength ranges not otherwise detectable using a photo-sensitive silicon substrate. Additionally, the techniques may provide a negative electric charge configured to stabilize the back surface of a silicon substrate for a back side illuminated electron-based sensor. A positively charged upconverting layer could be used for hole-based sensors. The techniques disclosed may provide a multi-functional layer configured to increase the NIR quantum efficiency and extend the wavelength range of silicon-based sensor, and provide stabilization of the back surface of a silicon substrate, which may provide for a lower cost visible and infrared sensor capable of sensing light in any of the UV/VIS/NIR/SWIR/MWIR/LWIR wavelength ranges.

In one example, this disclosure describes a sensor including: an upconversion layer comprising a plurality of crystals configured to convert electromagnetic radiation comprising a first range of wavelengths greater than 1100 nm to electromagnetic radiation comprising a second range of wavelengths less than or equal to 1100 nm; and a photo-sensitive silicon substrate configured to detect the electromagnetic radiation comprising the second range of wavelengths.

In another example, this disclosure describes a method of making a sensor, the method including: disposing an upconversion layer on a surface of a photo-sensitive silicon substrate, wherein the upconversion layer comprises a plurality of crystals, wherein the plurality of crystals are configured to convert electromagnetic radiation comprising a first range of wavelengths greater than 1100 nm to electromagnetic radiation comprising a second range of wavelengths less than or equal to 1100 nm, and wherein the photo-sensitive silicon substrate is configured to detect the electromagnetic radiation comprising the second range of wavelengths.

In another example, this disclosure describes a method of detecting electromagnetic radiation, the method including: converting, by an upconversion layer of a sensor, the upconversion layer comprising a plurality of crystals, electromagnetic radiation comprising a first range of wavelengths greater than 1100 nm to electromagnetic radiation comprising a second range of wavelengths less than or equal to 1100 nm; and detecting, by a photo-sensitive silicon substrate of the sensor, the electromagnetic radiation comprising the second range of wavelengths.

In another example, this disclosure describes a sensor including: a photo-sensitive silicon substrate configured to detect electromagnetic radiation; and a scattering layer comprising a plurality of crystals configured to scatter the electromagnetic radiation incident onto the photo-sensitive silicon substrate to increase an incidence angle, relative to the surface normal of the photo-sensitive silicon substrate, of at least a portion of the electromagnetic radiation.

The details of one or more examples of the techniques of this disclosure are set forth in the accompanying drawings and the description below. Other features, objects, and advantages of the techniques will be apparent from the description and drawings, and from the claims.

BRIEF DESCRIPTION OF DRAWINGS

FIG. 8 is a flow diagram of an example method of forming a sensor, in accordance with the techniques of the disclosure.

FIG. 9 is a flow diagram of an example method of detecting electromagnetic radiation, in accordance with the techniques of the disclosure.

Like reference characters refer to like elements throughout the figures and description.

DETAILED DESCRIPTION

Figure 1:
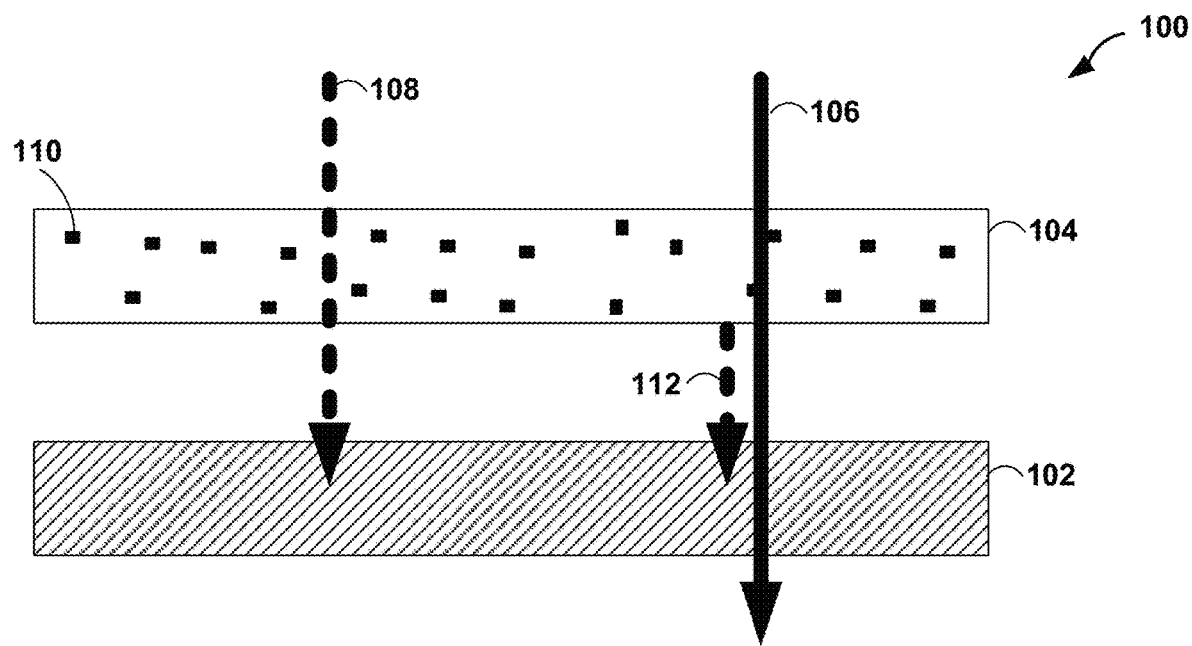
FIG. 1 is a cross-sectional block diagram illustrating an example sensor, in accordance with the techniques of the disclosure.

Detecting infrared light, e.g., short-wave infrared (SWIR), mid-wave infrared (MWIR), and long-wave infrared (LWIR) is typically done with materials and/or techniques capable of detecting the lower energy light, e.g., indium gallium arsenide (InGaAs) or other sensors, and is typically outside of the wavelength range of silicon-based sensors. For example, the long wavelength cut-off of silicon-based sensors is typically about 1100 nanometers (nm), where the absorption of silicon cuts off. Due to the cost of the materials and processing, such infrared light sensors may cost many times more than silicon-based sensors. As used herein, ultraviolet (UV) light includes electromagnetic radiation having wavelengths from the tens of nm to the low range of the sensitivity of the human eye, e.g., from about 10 nm (deep UV) to about 380 nm. Visible light wavelengths range from about 380 nm to 700 nm, near infrared (NIR) wavelengths range from about 700 nm to 1100 nm, SWIR wavelengths range from about 1100 nm to 3000 nm (e.g., 1.1 um to 3 um), MWIR wavelengths range from about 3 um to 5 um, and LWIR ranges from about 5 um to 14 um.

In accordance with the systems, devices, and techniques described here, a sensor comprises and upconversion layer including a plurality of crystals configured to convert electromagnetic radiation having a first range of wavelengths greater than 1100 nm to electromagnetic radiation having a second range of wavelengths less than or equal to 1100 nm and a photo-sensitive silicon substrate, e.g., configured to detect the electromagnetic radiation having the second range of wavelengths. In some examples, the crystals and upconversion layer may be applied to the top or back side of a silicon-based sensor and/or imaging sensor array, such as a CMOS imager, CCD imager, or the like. The application of the upconversion layer and crystals may not increase the dark current of the silicon-based sensor, may be applied "outside the foundry," e.g., after fabrication of the silicon-based sensor or sensor array at a foundry and reduce and/or eliminate the need for specialized silicon foundry processing. For example, the upconversion layer and/or crystals may be applied to a silicon-based sensor and/or sensor array after silicon wafers are formed and/or delivered from a foundry, and application of the upconversion layer and/or crystals post-sensor fabrication may not increase the dark current of such silicon-based sensors. The upconverting layer may not increase size, weight or power of the imaging system including.

In some examples, the example sensors described here (e.g., sensors 100-500, 1500, 1600 described below) may be useful for extending the responsivity of silicon-based sensors into the SWIR wavelength range, e.g., to sense relatively bright SWIR sources such as laser designators and fiber optic systems or the like or to measure beam distribution for eye safe lasers (e.g., when used in a sensor array). In some examples, the example sensors described herein may enable a silicon-based array to image laser designator light and overlay the laser designator image on a color or grayscale image from a detector array without an upconversion layer and crystals and having a lens operable in the visible to NIR wavelength range. In other words, the example sensors described herein may extend the capabilities of silicon-based sensors to improve threat detection, identification of eye safe and non-eye safe laser designators, locating eye safe and non-eye safe laser designators in a scene (e.g., via overlay with an image of a scene showing the field of view of the sensor and/or sensor array), provide night vision while allowing a user to see/detect laser designators on a remote target as well as to locate a SWIR laser, e.g., if the user is being laser designated.

FIG. 1 is a cross-sectional block diagram illustrating an example sensor 100, in accordance with the techniques of the disclosure. In the example shown, sensor 100 includes upconversion layer 104 and photo-sensitive silicon substrate 102 (also referred to herein as "silicon substrate 102"). Sensor 100 may be configured to sense electromagnetic radiation 106 and electromagnetic radiation 108 (also referred to herein as "light 106" and light "108").

Silicon substrate 102 may be configured to detect and/or sense light 108. For example, light 108 may comprise a range of wavelengths that is less than or equal to 1100 nm, e.g., UV/VIS/NIR light. In some examples, silicon substrate 102 may comprise a n-type channel within a p-type substrate (not shown in FIG. 1). Silicon substrate 102 may be substantially transparent to light 106. For example, light 106 may comprise a range of wavelengths that is greater than about 1100 nm, e.g., SWIR/MWIR/LWIR light. Although not illustrated in the figures, sensors that accord with techniques of this disclosure may include anodes, cathodes, support wires, a microlens, silicon doping, filters, and/or additional layers to support the operation of the sensor to convert detected electromagnetic radiation into electrical signals.

Upconversion layer 104 may include a plurality of crystals 110, and each crystal of the plurality of crystals 110 may be configured to convert at least a portion of light 106 to shorter range of wavelengths similar to the range of wavelengths of light 108. For example, crystals 110 may be configured to convert at least a portion of electromagnetic radiation 106 comprising a first range of wavelengths greater than 1100 nm to electromagnetic radiation 112 comprising a second range of wavelengths less than or equal to 1100 nm.

Crystals 110 may comprise a dopant configured to absorb light 106 and emit light 112. Light 112 may be similar to light 108 in that light 108 and light 112 comprise wavelengths less than or equal to 1100 nm. In some example, light 108 and light 112 may comprise the same range of wavelengths, and in other examples, light 108 and light 112 may each comprise a different range of wavelengths less than or equal to 1100 nm. For example, light 108 may comprise nighttime light, e.g., moonlight, clear skylight, overcast skylight, or the like, comprising a broad range of wavelengths following a blackbody spectral density curve according to Planck's law (e.g., generated by the sun) modified by the reflectivity of the moon and atmospheric absorption, and light 112 may comprise a relatively narrow range of wavelengths corresponding to the emission lines of the dopant or dopants, e.g., from about 510 nm to about 570 nm with a strong emission peak at about 540 nm corresponding to emission by erbium (Er) as dopant. In some examples, the dopant may comprise a rare-earth element, e.g., erbium, ytterbium, or any suitable rare-earth element.

Crystals 110 may comprise a material and/or compound configured to transmit light 108 and receive and/or capture one or more dopants. In some examples, crystals 110 may comprise a material and/or compound configured to transmit light 108, light 106, and light 112 and receive and/or capture one or more dopants. For example, the material of crystals 110 may be configured to retain the one or more dopants from dispersing, falling, aerating, or the like, and to allow light 106 to reach the dopant for absorption and re-emission as light 112. The material of crystals 110 may be further configured to allow the converted, emitted light 112 to exit crystals 110 so as to be absorbed/sensed/detected by silicon substrate 102. In some examples, crystals 110 may comprise a crystalline structure. In other examples, crystals 110 may comprise non-crystalline structure, and/or may not comprise crystalline structure. For example, crystals 110 may comprise a particle and/or material comprising a rare earth element but not in crystalline form. In some examples, crystals 110 may comprise gadolinium oxysulfide and one or more dopants. In some examples, crystals 110 may comprise aluminum oxide ($Al_2O_3$) and one more dopants.

In some examples, crystals 110 may be substantially opaque to light 108. For example, crystals 110 may comprise a material that has a substantially low, or no, transmission for the wavelengths of light 108. The material may have any or all of a substantially high absorption of light 108, a substantially high reflectivity, or a substantially high backscatter of light 108.

Figure 6:
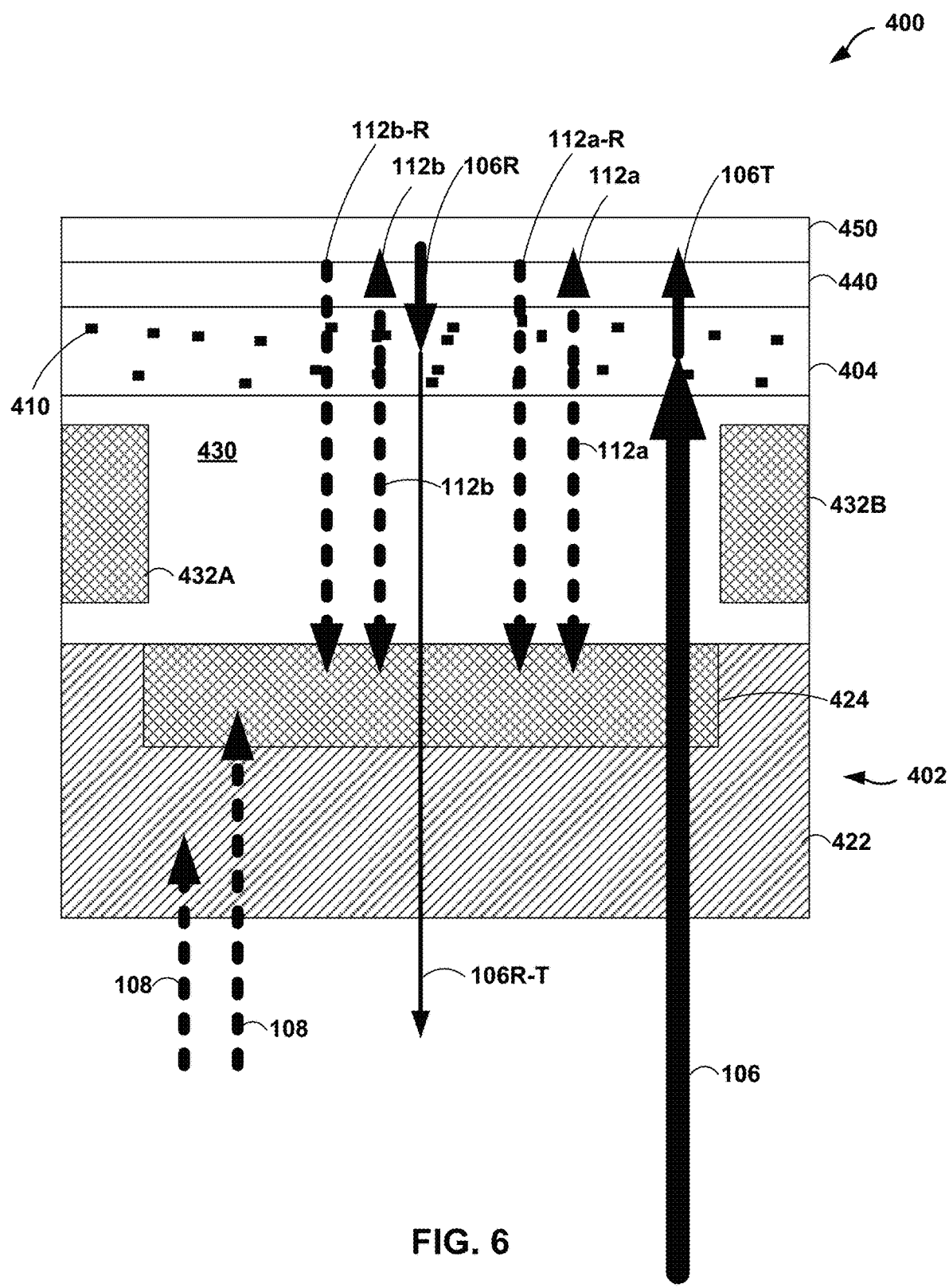
FIG. 6 is a cross-sectional block diagram illustrating an example sensor, in accordance with the techniques of the disclosure.

In some examples, upconversion layer 104 and crystals 110 may be used with silicon substrate 102 in a front side illuminated configuration (e.g., as illustrated in FIGS. 1-3, 7, and 14-15) or in a back side illuminated configuration (BSI) (e.g., as illustrated in FIGS. 4 and 6). In a front side illuminated configuration, upconversion layer 104 and crystals 110 may overlie silicon substrate 102 by being disposed between silicon substrate 102 and incident light 108 and incident light 106. In a back side illuminated configuration, upconversion layer 104 and crystals 110 may underlie silicon substrate 102 by being disposed opposite silicon substrate 102 from incident light 108 and incident light 106, e.g., the incident light that reaches upconversion layer 104 and crystals 110 first transmits through silicon substrate 102.

In examples in which crystals 110 may be substantially opaque to light 108 and upconversion layer 104 is in a front side illuminated configuration, upconversion layer 104 may be configured to transmit at least a portion of light 108 (e.g., a portion of incident electromagnetic radiation comprising the range of wavelengths less than or equal to 1100 nm) to be incident on the photo-sensitive silicon substrate. For example, the plurality of crystals 110 may be sparsely dispersed on silicon substrate 102 (e.g., within upconversion layer 104). In some examples, crystals 110 may be sparsely dispersed such that at least a portion of the plurality of crystals 110 are dispersed within upconversion layer 104 to have a gap between adjacent crystals 110 that extends through the thickness of upconversion layer 104. In other words, crystals 110 may be sparsely dispersed such that there is a "line of sight" for at least a portion of light 108 to propagate through upconversion layer 104 to be incident on silicon substrate 102 without interacting with crystals 110. In some examples, the plurality of crystals 110 may be sparsely dispersed such that crystals 110 overlie less than or equal to 99% of the surface area of silicon substrate 102, or less than or equal to 50% of the surface area of silicon substrate 102, or less than or equal to 25% of the surface area of silicon substrate 102, or less than or equal to 10% of the surface area of silicon substrate 102, or less than or equal to 5% of the surface area of silicon substrate 102, or less than or equal to 1% of the surface area of silicon substrate 102. In some examples, the plurality of crystals 110 are substantially uniformly dispersed over the surface area of silicon substrate 102.

In some examples, crystals 110 may range in size from greater than or equal to 0.1 micrometers (e.g., microns) and less than or equal to 100 micrometers. For example, crystals 110 may range in size from about 0.1 micrometers to about 100 micrometers, or from about 1 micrometer to about 20 micrometers, or from about 5 micrometers to about 8 micrometers. For example, crystals 110 may have an irregular shape, but each crystal may have an effective diameter of about 1 micrometer to about 20 micrometers, or from about 5 micrometers to about 8 micrometers. In some examples, the effective diameter of a crystal 110 may correspond to the largest dimension (e.g., longest length in a single direction) of the crystal 110. In some examples, the size of crystals 110 may be defined by the structure of the lattice and/or lattice size, which may in turn be defined by the material and/or materials comprising the crystals 110.

Figure 4A:
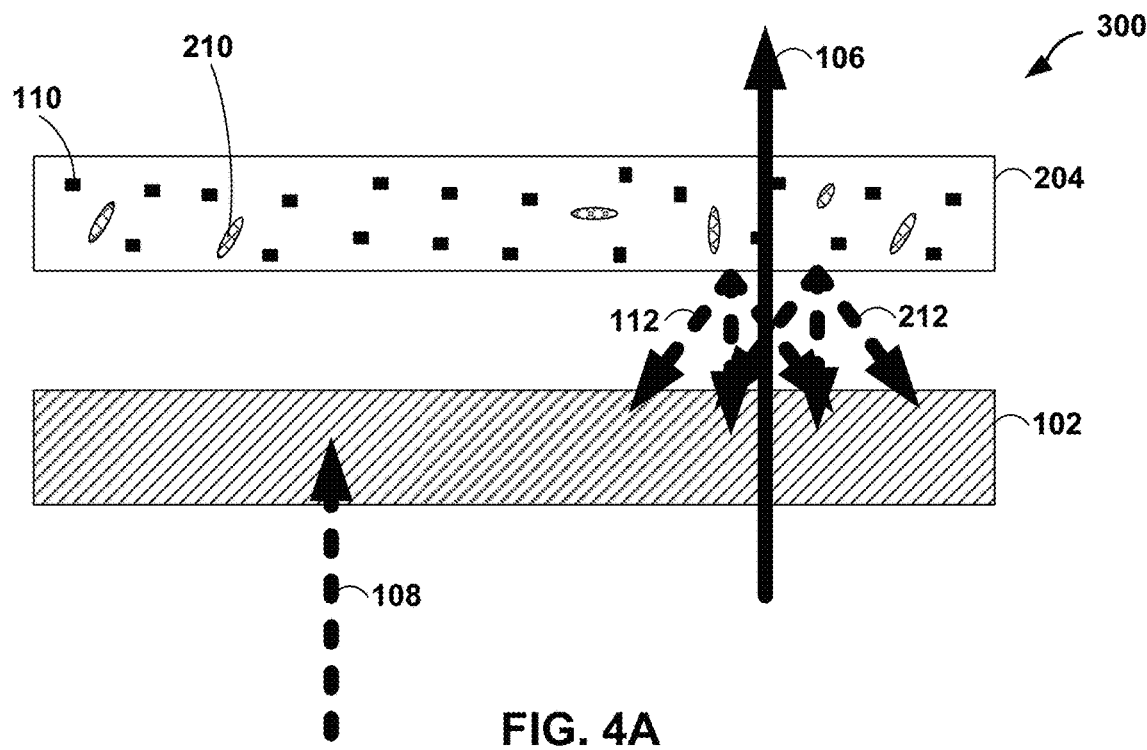
FIG. 4A is a cross-sectional block diagram illustrating an example sensor, in accordance with the techniques of the disclosure.
Figure 4B:
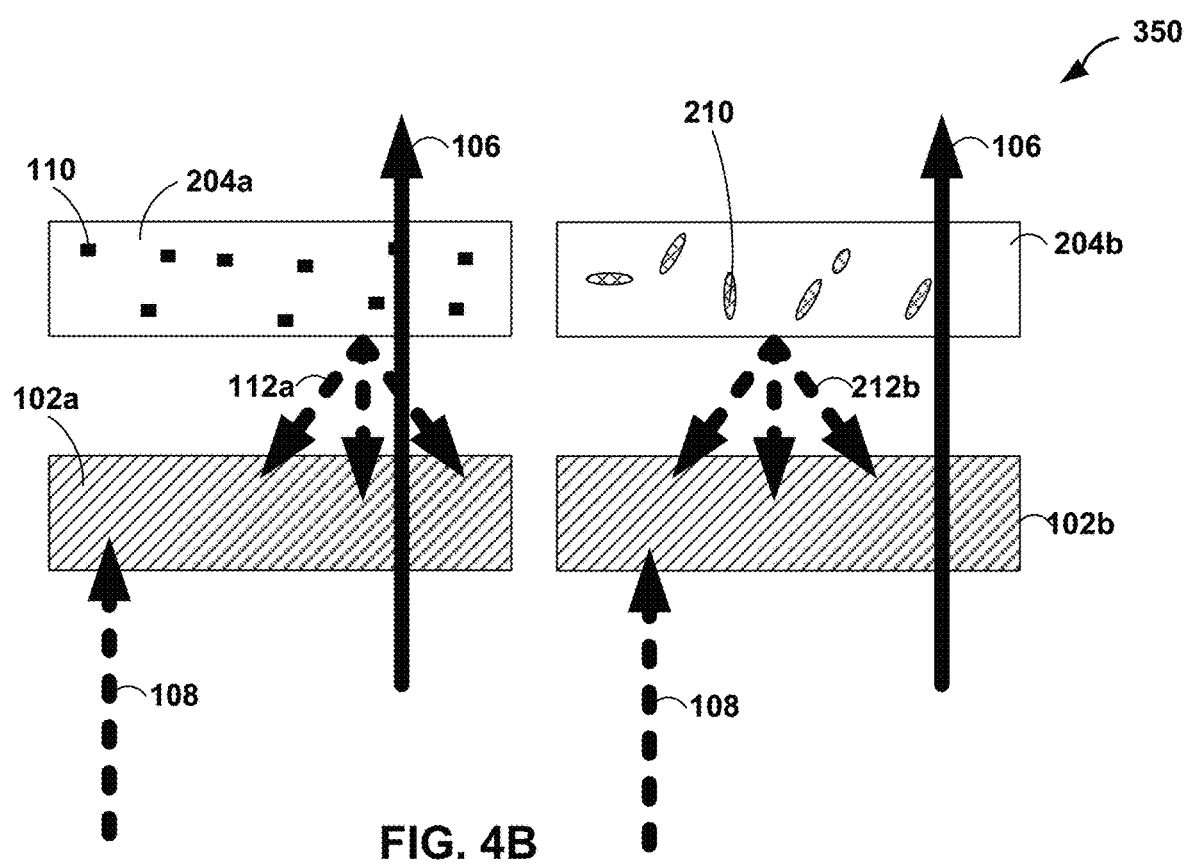
FIG. 4B is a cross-sectional block diagram illustrating an example sensor, in accordance with the techniques of the disclosure.
Figure 5:
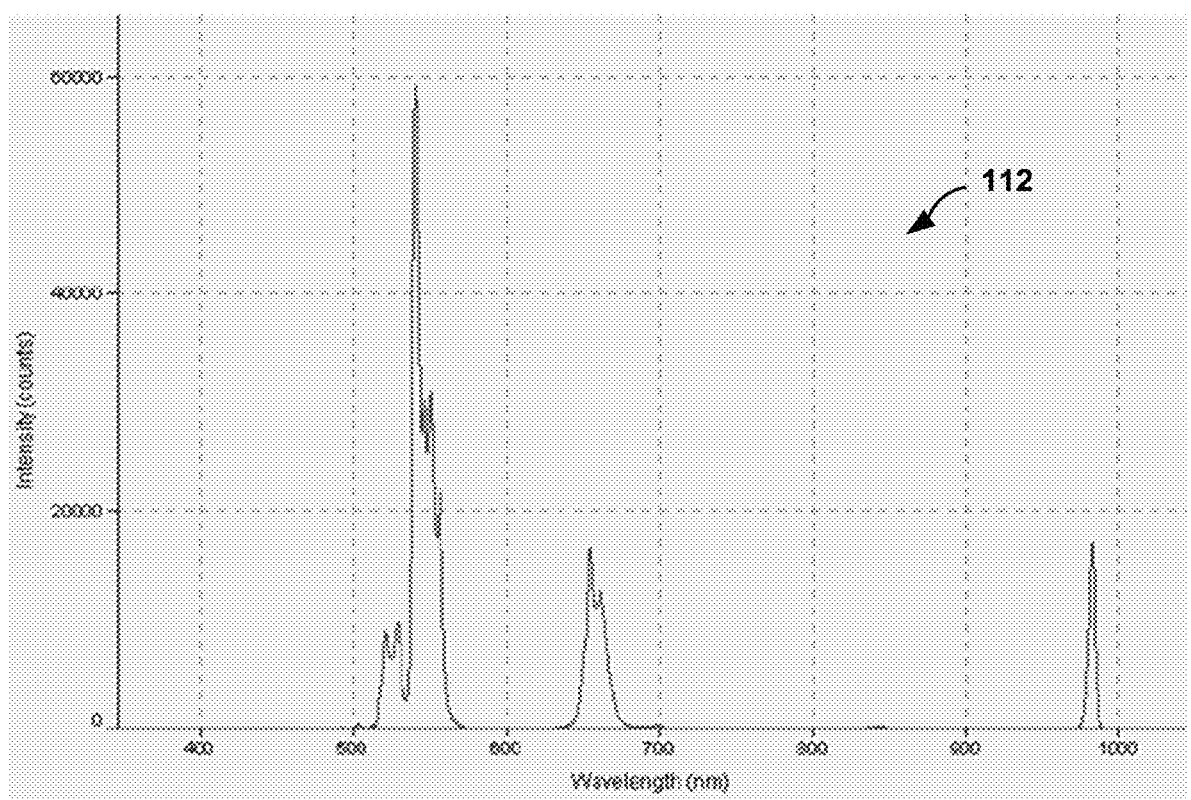
FIG. 5 is a plot of an emission spectra of an example upconversion layer, in accordance with the techniques of the disclosure.

Crystals 110 comprise one or more dopants configured to convert light 106 to light 112 having an emission spectra comprising wavelengths less than or equal to 1100 nm. In some examples, the concentration and dopant types may be used to tailor the emission spectra. For example, crystals 110 may comprise a plurality of dopants each configured to emit a portion of the wavelengths of light 112, as illustrated in FIG. 4B and FIG. 5. FIG. 5 is a plot of the emission spectra of an example upconversion layer 104, in accordance with the techniques of the disclosure. In the example shown, crystals 110 may comprise erbium-doped crystals configured to convert SWIR light (e.g., 1550 nm light) to visible 540 nm light, and ytterbium-doped aluminum oxide crystals configured to convert SWIR light to 650 nm light and/or 980 nm light. In some examples, the same crystal may be doped with both dopants, and in other examples different crystals may include the different dopants. In some examples, the different dopants may convert at least a portion of light 106 by absorbing and convert emitted light. For example, an ytterbium dopant may absorb SWIR light by exciting an electron to populate the 5f orbital of an ytterbium atom, which may then decay to a lower orbital by emitting light having a frequency that excites an electron of an erbium dopant atom to populate an orbital of its fourth shell, which may then decay to a lower orbital by emitting light 112.

Returning to FIG. 1, in some examples, increasing the amount of the one or more dopants that crystals 110 are doped with increases the conversion efficiency of converting light 106 to light 112, e.g., a greater amount of doping may increase the amount of light 112 emitted by crystals 110 give an amount of light 106 incident on crystals 110. In some examples, increasing the doping distorts the structure of crystals 110, e.g., the dopants may distort the crystal lattice, and may decrease the conversion efficiency of the crystal. In some examples, crystals 110 may comprise a doping concentration up to a threshold dopant concentration level. The threshold dopant concentration level may be a dopant concentration level at which increasing the dopant concentration decreases the conversion efficiency of crystals 110.

In some examples, upconversion layer 104 further comprises a binder material. For example, upconversion layer 104 may comprise crystals 110 dispersed within a binder and/or encapsulating material. In other examples, upconversion layer 104 may not comprise a binder material and may represent a volume throughout which crystals 110 are dispersed. For example, crystals 110 may be placed on a surface of silicon substrate 102, e.g., "sprinkled" or otherwise deposited over a surface area of silicon substrate 102. In other examples, crystals 110 may be disposed and/or dispersed onto and over a surface area of silicon substrate via a carrier material, e.g., crystals 110 may be coated onto silicon substrate 102. For example, crystals 110 may be dispersed within a relatively low viscosity material which may be subsequently removed after being disposed on silicon substrate 102, such as acetone, an alcohol, or other carrier material configured to disperse crystals 110 over a surface area of silicon substrate 110 when coated and/or sprayed onto silicon substrate 110. In the case of an alcohol as a carrier, the carrier may then subsequently evaporate, and upconversion layer 104 may comprise crystals 110 (including one or more dopants) dispersed over a surface area of silicon substrate 110. Although illustrated as separated from silicon substrate 102 in FIG. 1, upconversion layer 104 may be in contact with a surface of silicon substrate 102.

In some examples, crystals 110 may be held, attached, adhered, or otherwise affixed to a surface of silicon substrate 102. For example, upconversion layer 104 may comprise a binder configured to retain crystals 110 and adhere to silicon substrate 102. In other examples, crystals 110 may be held to silicon substrate 102 an electrical charge, e.g., via an electrical and/or electrostatic charge (e.g., and without a binder material and/or carrier material).

Figure 2A:
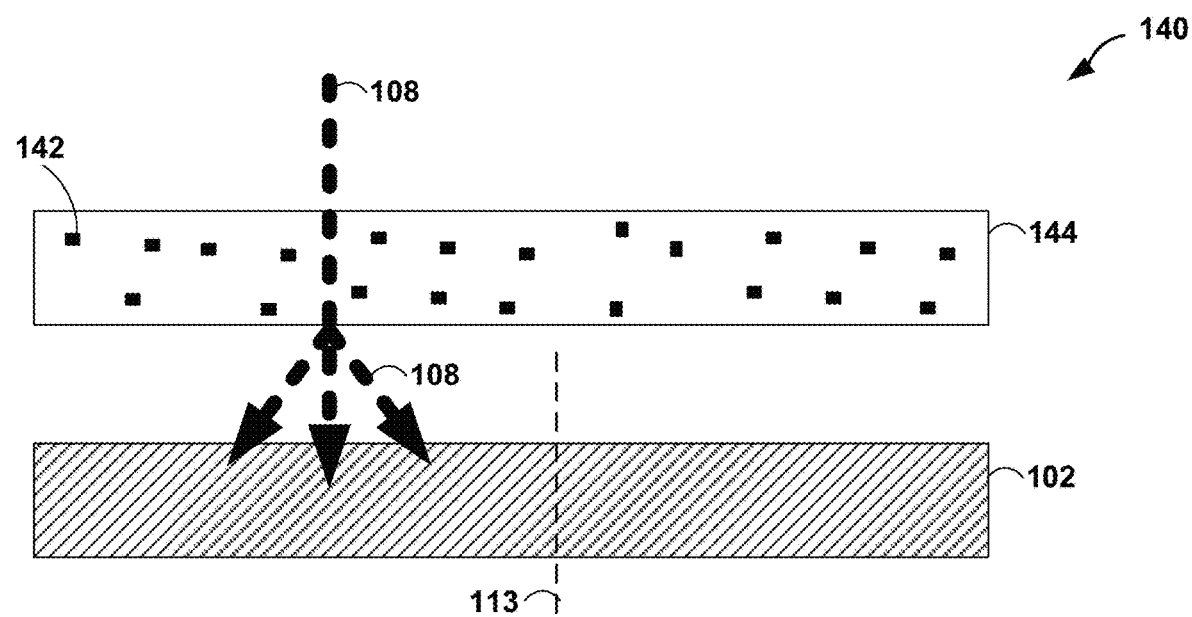
FIG. 2A is a cross-sectional block diagram illustrating an example sensor, in accordance with the techniques of the disclosure.

In some examples, crystals within a layer may be configured to scatter electromagnetic radiation, e.g., electromagnetic radiation comprising the second range of wavelengths (e.g., light 108) incident onto photo-sensitive silicon substrate 102 to increase an incidence angle, relative to the surface normal 113 of photo-sensitive silicon substrate 102, of at least a portion of the electromagnetic radiation comprising the second range of wavelengths (e.g., light 108) as illustrated in FIG. 2A. FIG. 2A is a cross-sectional block diagram illustrating an example sensor 140, in accordance with the techniques of the disclosure. Sensor 140 includes photo-sensitive silicon substrate 102 and scattering layer 144. Scattering layer 144 includes crystals 142. In some examples, crystals 142 may be substantially similar to crystals 110 described above, except that crystals 142 may not have a dopant, and scattering layer 144 may be similar to upconversion layer 104. However, scattering layer 144 includes a plurality of crystals 142 rather than a plurality of crystals 110. In the example shown, crystals 142 are configured to scatter and/or alter the direction of light 108. Scattering light 108 may increase the mean path length that light 108 traverses within silicon substrate 102, and thereby increases the quantum efficiency of sensor 140 by increasing the number of light 108 photons absorbed by silicon substrate 102. For example, light 108 may be incident on silicon substrate within a range of incidence angles, and crystals 142 may be configured to scatter light 108 to increase the range of incidence angles of light 108 and/or increase the proportion of light 108 incident on silicon substrate 102 at the higher incidence angles of the range of incidence angles. As such, crystals 110 are configured to increase the mean path length traveled by light 108 within silicon substrate 102, which in turn increases the number of light 108 photons absorbed by silicon substrate 102 (e.g., via Beer-Lambert law type absorbance).

For example, in order to increase quantum efficiency, a silicon substrate of a conventional silicon-based sensor may be formed to be relatively thick. This may have detrimental effects on sensor resolution, e.g., the modulation transfer function of the sensor and/or an sensor array comprising such a relatively thick sensor, sensor dark current, processing complexity, cost of such a sensor. Alternatively, in accordance with the techniques here, crystals 110 may be configured to scatter light 108 to increase the quantum efficiency of sensor 100, at least as to light 108, and thereby enable silicon substrate 102 to be formed to be relatively thin. In some examples, crystals 142 may be configured to scatter light 108 having wavelengths ranging from 800 nm to 1050 nm, e.g., corresponding the NIR wavelengths important for nighttime imaging and the illumination spectrum of the night sky. In some examples, sensor 100 may be configured to have a relatively thin silicon substrate 102 and scattering layer 140 may be configured to improve the MTF and quantum efficiency (e.g., sensitivity) of a night vision sensor and/or or sensor array to increase a recognition range, e.g., the distance at which an object in a scene may be recognized and/or identified. Sensor 140 may be configured to improve/increase a nighttime recognition range.

Figure 2B:
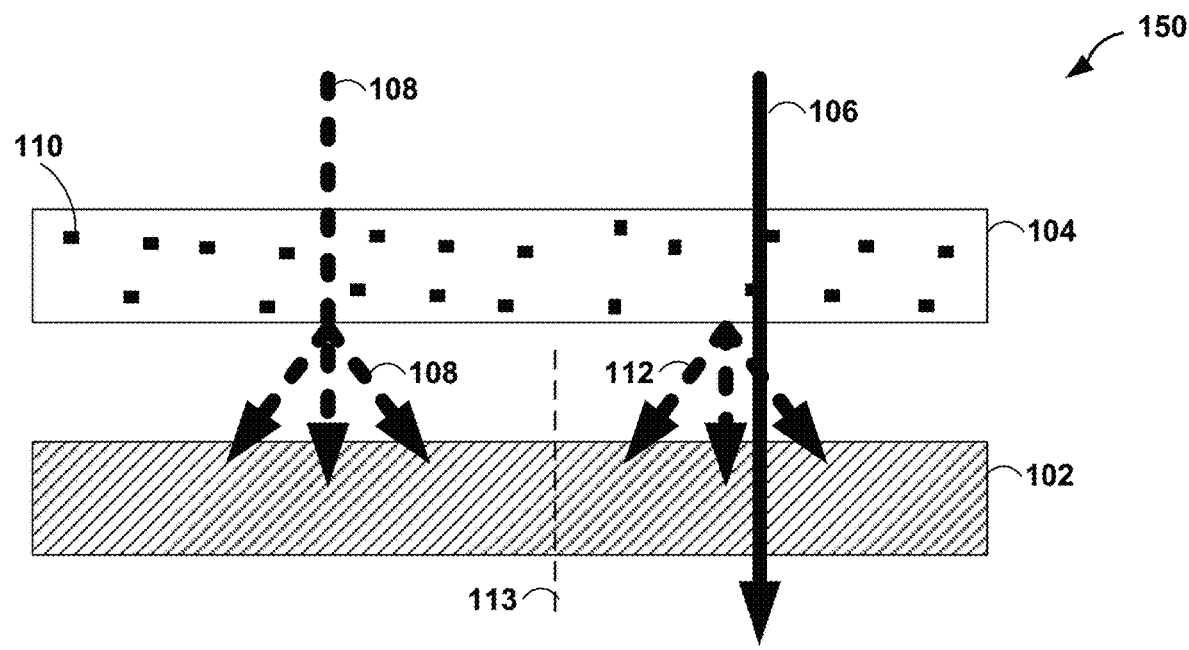
FIG. 2B is a cross-sectional block diagram illustrating an example sensor, in accordance with the techniques of the disclosure.

In some examples, upconversion layer 104 may be configured to both upconvert and scatter electromagnetic radiation. For examples, crystals 110 may be configured to both scatter light 108 into a range of angles and convert light 106 to light 112 emitted into a range of angles, e.g., as illustrated in FIG. 2B. FIG. 2B is a cross-sectional block diagram illustrating an example sensor 150, in accordance with the techniques of the disclosure. In the example shown, crystals 110 are configured to scatter and/or alter the direction of light 108. Scattering light 108 may increase the mean path length that light 108 traverses within silicon substrate 102, and thereby increases the quantum efficiency of sensor 150 by increasing the number of light 108 photons absorbed by silicon substrate 102. For example, light 108 may be incident on silicon substrate within a range of incidence angles, and crystals 110 may be configured to scatter light 108 to increase the range of incidence angles of light 108 and/or increase the proportion of light 108 incident on silicon substrate 102 at the higher incidence angles of the range of incidence angles. As such, crystals 110 are configured to increase the mean path length traveled by light 108 within silicon substrate 102, which in turn increases the number of light 108 photons absorbed by silicon substrate 102 (e.g., via Beer-Lambert law type absorbance).

As described above, in order to increase quantum efficiency, a silicon substrate of a conventional silicon-based sensor may be formed to be relatively thick. In accordance with the techniques here, crystals 110 may be configured to scatter light 108 to increase the quantum efficiency of sensor 100, at least as to light 108, and thereby enable silicon substrate 102 to be formed to be relatively thin. Similarly, crystals 110 may be configured to emit light 112 into a relatively large range of incidence angles to increase the mean path length traveled by light 112 within silicon substrate 102 and thereby increase the quantum efficiency of sensor 100 at least as to light 112. In some examples, crystals 110 may be configured to scatter light 108 having wavelengths ranging from 800 nm to 1050 nm, e.g., corresponding the NIR wavelengths important for nighttime imaging and the illumination spectrum of the night sky. In some examples, sensor 100 may be configured to have a relatively thin silicon substrate 102 and upconversion layer 104 configured to improve the MTF and quantum efficiency (e.g., sensitivity) of a night vision sensor and/or or sensor array to increase a recognition range, e.g., the distance at which an object in a scene may be recognized and/or identified. Sensor 150 may be configured to improve/increase a nighttime recognition range.

Figure 3:
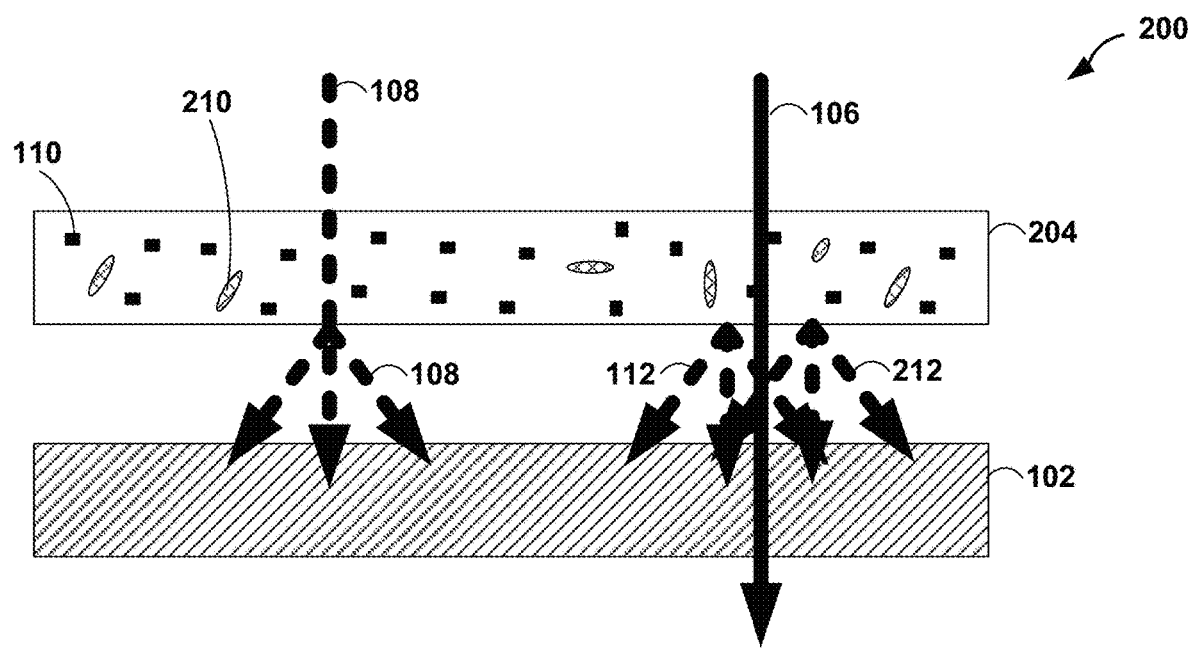
FIG. 3 is a cross-sectional block diagram illustrating an example sensor, in accordance with the techniques of the disclosure.

In some examples, crystals 110 may comprise a plurality of different crystal types (e.g., different crystal material and/or crystal structure) having different (or the same) one or more dopants and each having a range of sizes, e.g., as illustrated in FIG. 3. FIG. 3 is a cross-sectional block diagram illustrating an example sensor 200, in accordance with the techniques of the disclosure. In the example shown, sensor 200 includes upconversion layer 204 and photo-sensitive silicon substrate 102. Sensor 200 may be substantially similar to sensor 100 described above, except that upconversion layer 204 includes both a plurality of crystals 110 and a plurality of crystals 210. In some examples, crystals 210 may be substantially similar to crystals 110 described above but comprising a different crystal material and/or a different one or more dopant. In some examples, crystals 210 may be configured to convert light 106 to be light 212, which may be substantially similar to light 112 except with a different mix of wavelengths less than or equal to 1100 nm.

In some examples, upconversion layer 104 may underlie silicon substrate 102. FIG. 4A is a cross-sectional block diagram illustrating an example sensor 300, in accordance with the techniques of the disclosure. In the example shown, sensor 300 includes upconversion layer 204 and photo-sensitive silicon substrate 102. Sensor 300 may be substantially similar to sensor 200 described above, except that upconversion layer 204 underlies silicon substrate 102. For example, upconversion layer 204 (and crystals 110 and 210) may underlie silicon substrate 102 by being disposed opposite silicon substrate 102 from incident light 108 and incident light 106. In some examples, sensor 300 may be substantially similar to sensor 100 described above, except that upconversion layer 204 underlies silicon substrate 102.

In some examples, silicon substrate 102 may be substantially transparent to light 106. In the example shown, light 106 may transmit through silicon substrate 102 and at least a portion of light 106 may be absorbed by crystals 110 and/or 210 within upconversion layer 204 (or upconversion layer 104, not shown). Whether underlying or overlying silicon substrate 102, upconversion layer 204 (and/or upconversion layer 104) may convert light 106 to light 112 and/or 212 via emission of light 112 and/or 212 in a plurality of directions, e.g., in a generally forward direction (e.g., substantially along the same direction as incident light 106), in a generally backward direction (e.g., substantially along the opposite direction as incident light 106), isotropically (e.g., relatively uniformly in all directions), or along some other direction with at least a portion of light 112 emitted towards silicon substrate 102. The example shown in FIG. 4A may correspond to a back side illuminated (BSI) sensor configuration (e.g., a BSI pixel), and the examples shown in FIGS. 1-3 may correspond to a front side illuminated sensor configuration.

In some examples, upconversion layers 100 and/or 200 may have a greater amount of crystals 110 and/or 210 when underlying silicon substrate 102, e.g., in a BSI configuration. Because upconversion layer 104 and/or 204 may not need to transmit light 108 (which is absorbed by silicon substrate 102), upconversion layer 104 and/or 204 may comprise crystals 110 and/or 210 that are not sparsely dispersed, but rather substantially densely dispersed within upconversion layer 110 and/or 210.

In some examples, the plurality of crystals 110 may be substantially opaque to light 108, as described above, and substantially densely dispersed such that crystals 110 and/or 210 underlie greater than or equal to 1% of the surface area of silicon substrate 102, or greater than or equal to 50% of the surface area of silicon substrate 102, or greater than or equal to 75% of the surface area of silicon substrate 102, or greater than or equal to 90% of the surface area of silicon substrate 102, or greater than or equal to 95% of the surface area of silicon substrate 102, or greater than or equal to 99% of the surface area of silicon substrate 102. In some examples, the plurality of crystals 110 and/or 210 are substantially uniformly dispersed over the surface area of silicon substrate 102. In some examples, crystals 110 and/or 210 may be densely dispersed within upconversion layer 110 and/or 210 such that there are no gaps between adjacent crystals that extend through the thickness of upconversion layer 110 and/or 210. In other words, crystals 110 may be densely dispersed such that there is no "line of sight" for at least a portion of light 108 to propagate through upconversion layer 104 without interacting with at least a portion of crystals 110.

In some examples, a plurality of upconversion layers may be used with a plurality of silicon substrates, e.g., the plurality of upconversion layers may function similarly to color filters and may independently upconvert different wavelengths or wavelength regions. FIG. 4B is a cross-sectional block diagram illustrating an example sensor 350, in accordance with the techniques of the disclosure. In the example shown, sensor 350 includes upconversion layer 204a including a plurality of crystals 110 and underlying photo-sensitive silicon substrate 102a and upconversion layer 204b including a plurality of crystals 210 and underlying photo-sensitive silicon substrate 102b. Sensor 350 may be substantially similar to sensor 300 described above, except that crystals 110 and 210 may be disposed in different regions to overlie or, as shown in FIG. 4B, underlie different silicon substrates 102a, 102b. In some examples, crystals 110 and 210 may be configured to be disposed in different regions or, as shown in FIG. 4B, in different layers 204a, 204b that are spatially separated. In some examples, crystals 110 may be configured to upconvert a different wavelength and/or wavelengths than crystals 210, to be light 112. In some examples, crystals 110 may be configured to upconvert a portion of the wavelengths of light 106 to be light 112a and crystals 210 may be configured to upconvert a different portion of the wavelengths of light 106 to be light 112b. In other words, crystals 110 may be configured to configured to convert electromagnetic radiation including a first range wavelengths (which are greater than 1100 nm, e.g., a first spectral content or "color") and crystals 210 may be configured to configured to convert electromagnetic radiation including a second range wavelengths (which are greater than 1100 nm, e.g., a second spectral content or "color"), and the first and second range of wavelengths include at least one wavelength that is different from each other, e.g., the first and second wavelength ranges have different spectral content and are different "colors."

In some examples, 112a and 112b may be the same, and in other examples 112a and 112b may have different spectral content, e.g., may include different wavelengths, but that are still less than or equal to 1100 nm. In the example shown, silicon substrate 102a may detect light 112a, and silicon substrate 102b may detect light 112b (in some examples, whether or not 112a and 112b have the same or different spectral content), and silicon substrates 102a and 102b may be read out independently, e.g., output a signal proportional to the portion of light 106 upconverted by crystals 110 and the portion of light 106 upconverted by crystals 210 independently. For example, sensor 350 may be configured to detect the amount and/or spectral content of light 106. The approach may be used, for example, as a way to determine multiple laser wavelengths within a filed of view.

FIG. 6 is a cross-sectional block diagram illustrating an example sensor 400, in accordance with the techniques of the disclosure. Sensor 400 may be a BSI sensor substantially similar to sensor 300 described above, except sensor 400 includes additional components such as reflector 450 and illustrates further sensor detail such as dielectric layer 430 including metal layers 432A, 432B.

In the example shown, sensor 400 includes photo-sensitive silicon substrate 402 (also referred to as "silicon substrate 402"), which may be substantially similar to silicon substrate 102 described above and including p-type epitaxial layer 422 and n-type photo diode 424. Incident light 108, comprising wavelengths less than or equal to 1100 nm, may be absorbed, sensed, detected by silicon substrate 402. For example, a portion of light 108 may be absorbed by p-type epitaxial layer 422 after penetrating a depth of a few micrometers within silicon substrate 102, e.g., before reaching n-type photodiode 424. For example, higher frequency/energy light having wavelengths less than 700 nm may be absorbed within the first few micrometers from the surface of silicon substrate 402 which light 108 is incident on. Portions of light 108 having longer wavelengths, e.g., 700 nm to 1100 nm, may penetrate farther, e.g., 10 micrometers or more through p-type epitaxial layer 422, and may reach n-type photodiode and may be absorbed, sensed, detected by n-type photodiode 424.

Sensor 400 may include dielectric layer 430, which may be substantially transparent to light 108, light 106, and upconverted light 112. Dielectric layer 430 may be configured to house metal layers 432A and 432B (collectively "metal layers 432"), which may be disposed around a perimeter outside of the area of n-type photodiode 424, e.g., outside of the clear aperture of sensor 400 and within a "black matrix" area and may be configured to house opaque wires and circuitry configured to readout electrical signals generated by silicon substrate 402 sensing (absorbing) light 108 and/or light 112. Metal layers 432 may comprise conductive materials, e.g., conductive traces, conductive vias, semiconductors, or any material or component configured to receive and/or readout sensed and/or detected signals from silicon substrate 402. In some examples, sensor 400 may comprise a pixel within an array of sensors 400, and metal layers 432 may be located in a black matrix area outside of and about at least a portion of the perimeters of the individual sensor 400 pixels of the array. Metal layers 432 may be substantially opaque and non-transmissive to any or all of light 108, light 106, and light 112.

In some examples, dielectric layer 430 may be adjacent to and in contact with silicon substrate 402. Metal layers 432 may be electrically connected to one or both of p-type epitaxial layer 422 and n-type photodiode 424. In the example shown, dielectric layer 430 is in contact with the surface of silicon substrate 402 opposite the surface on which light 108 and light 106 is incident, e.g., on the top side of silicon substrate 102.

Sensor 400 includes upconversion layer 404, which maybe substantially similar to one or both of upconversion layers 104 and 204 described above. Upconversion layer 404 includes a plurality of crystals 404 which may be substantially similar to one or both of crystals 110 and 210 described above. Crystals 410 (and upconversion layer 404) may be configured to convert light 106 to light 112. In the example shown, crystals 410 (and upconversion layer 404) is configured to convert light 106 via absorbing a portion of light 106 and isotropically emitting light 112. For example, light 106 may be incident on a surface of silicon substrate 402, which may be substantially transparent to light 106. Light 106 may transmit through silicon substrate 402 and dielectric layer 430 to be incident on upconversion layer 404. A first portion of light 106 may transmit through upconversion layer 404, e.g., light 106T, and be otherwise lost (e.g., unconverted and not sensed/detected) without reflector 450. A second portion of light 106 may be converted to light 112a and emitted isotropically from upconversion layer 404. A first portion of light 112a may propagate away from silicon substrate 402 and otherwise be lost (e.g., not sensed/detected) without reflector 450. A second portion of light 112a may propagate towards silicon substrate and transmit through upconversion layer 404 and dielectric layer 430 and be absorbed/sensed/detected by silicon substrate 402, e.g., by n-type photodiode 424 and/or p-type epitaxial layer 422.

Sensor 400 may include reflector 450. Reflector 450 may be configured to reflect light 106 and/or light 112 (e.g., light 112a, 112a-R, 112b, or 112b-R in the example shown and collectively referred to as "light 112"), and in some examples, light 108 (e.g., if silicon substrate 402 is thin enough that a portion of light 108 transmits through silicon substrate 402 to reach reflector 450). Upconversion layer 404 and reflector 450 may underlie silicon substrate 402. In the example shown, upconversion layer is adjacent to, underlies, and is in contact with dielectric layer 430, which is adjacent to, underlies, and is in contact with silicon substrate 402, and reflector 450 underlies upconversion layer 450.

In some examples, sensor 400 includes transparent layer 440. Transparent layer 440 may be configured to be substantially transmissive and/or transparent to light 106, light 112, and/or light 108, and may function to form a reflective cavity, e.g., to take advantage of constructive interference of light 106 and/or light 112 (and/or light 108). In other words, transparent layer 440 may be a spacer with a tailored thickness and/or index of refraction and configured to work in conjunction with at least reflector 450 to form an etalon to increase at least a portion of the wavelengths of light 106, 112, and/or 108, e.g., a Fabry-Perot type etalon. In some examples, transparent layer 440 may be configured to planarize a surface of upconversion layer 440, e.g., to provide a substantially planar surface to be adjacent to reflector 550 and/or on which to dispose reflector 450.

In some examples, reflector 450 is configured to reflect at least a portion of light 112a, e.g., light 112a-R, and direct light 112a-R towards silicon substrate 402 to be absorbed/sensed/detected by silicon substrate 402. In this way, reflector 450 may increase the quantum efficiency and/or sensitivity of sensor 400, e.g., relative to sensors 100, 150, 200, or 300. In some examples, reflector 450 may be configured to reflect light 112a-R with a spectral content that is different from light 112a, but still comprising wavelengths that are less than or equal to 1100 nm. For example, the spectral reflectivity of reflector 450, or a reflective cavity comprising reflector 450, may not be spectrally uniform as to light 112a.

In some examples, reflector 450 is configured to reflect at least a portion of light 106T, e.g., light 106R, and direct light 106R towards upconversion layer 404 and silicon substrate 402. Crystals 410 (and upconversion layer 404) may then convert at least a portion of light 106R to light 112b by isotropically emitting light 112b. Light 112b may be substantially similar to light 112a, e.g., upconversion layer 404 may emit a first portion of light 112b towards reflector 450 and a second portion of light 112b towards silicon substrate 402 to be absorbed/sensed/detected by silicon substrate 402. In this way, reflector 450 may further increase the quantum efficiency and/or sensitivity of sensor 400, e.g., relative to sensors 100, 200, or 300. In some examples, reflector 450 may be configured to reflect light 106R with a spectral content that is different from light 106, but still comprising wavelengths that are greater than 1100 nm. For example, the spectral reflectivity of reflector 450, or a reflective cavity comprising reflector 450, may not be spectrally uniform as to light 106T. As such, the spectral content of light 112b may differ from that of light 112a by virtue of crystals 410 converting a different spectral content of light 106, e.g., light 106R. In some examples, crystals 410 may convert light 106R to be light 112b having the same spectral content as light 112a, e.g., regardless of the differing spectral contents of light 106T and 106R. Similar to as described above, reflector 450 may reflect a portion of light 112b, e.g., light 112b-R, and direct light 112b-R towards silicon substrate 402 to be absorbed/sensed/detected by silicon substrate 402. In this way, reflector 450 may further increase the quantum efficiency and/or sensitivity of sensor 400, e.g., relative to sensors 100, 150, 200, or 300. Similar to as described above with light 112a-R, in some examples, reflector 450 may be configured to reflect light 112b-R with a spectral content that is different from light 112b, but still comprising wavelengths that are less than or equal to 1100 nm. In the example shown, a portion of light 106R may not be converted, e.g., light 106R-T, and may transmit through upconversion layer 404, dielectric layer 430, and silicon substrate 402 and exit sensor 400.

In some examples, a back silicon surface of silicon substrate 404 may be stabilized, e.g., as a back side illuminated sensor. In conventional silicon-based sensors, the back silicon surface may be stabilized via back side pinning to reduce dark current and produce a sharp gradient electric field to prevent electron hole recombination, e.g., via using a process including backside implanting and furnace heating, or laser annealing to activate the implant in the crystal lattice. For n-channel, p-substrate imagers (e.g., sensors including n-type photodiode 424 and p-type epitaxial layer 422), a negative charge may be used to stabilize the back surface. Conventional sensors may implement a negative charge via atomic layer deposition (ADS) of aluminum oxide or hafnium oxide. Alternatively, in some examples, upconversion layer 404 may be configured to provide a negative electric change configured to stabilize the surface of silicon substrate 402, which may reduce processing complexity for forming silicon-based BSI sensors and/or sensor arrays. For example, upconversion layer 404 may be formed with a passivation layer including aluminum oxide, or hafnium oxide, or the like, and that may be configured to have a permanent electric charge, e.g., a negative charge. The passivation layer may be formed via atomic layer deposition of aluminum oxide or hafnium oxide. In some examples, upconversion layer 404 including a passivation layer eliminates the need to form a silicon-based sensor with an additional layer including aluminum oxide or hafnium oxide to provide a negative change to stabilize the back surface of the silicon to reduce dark current.

Figure 7:
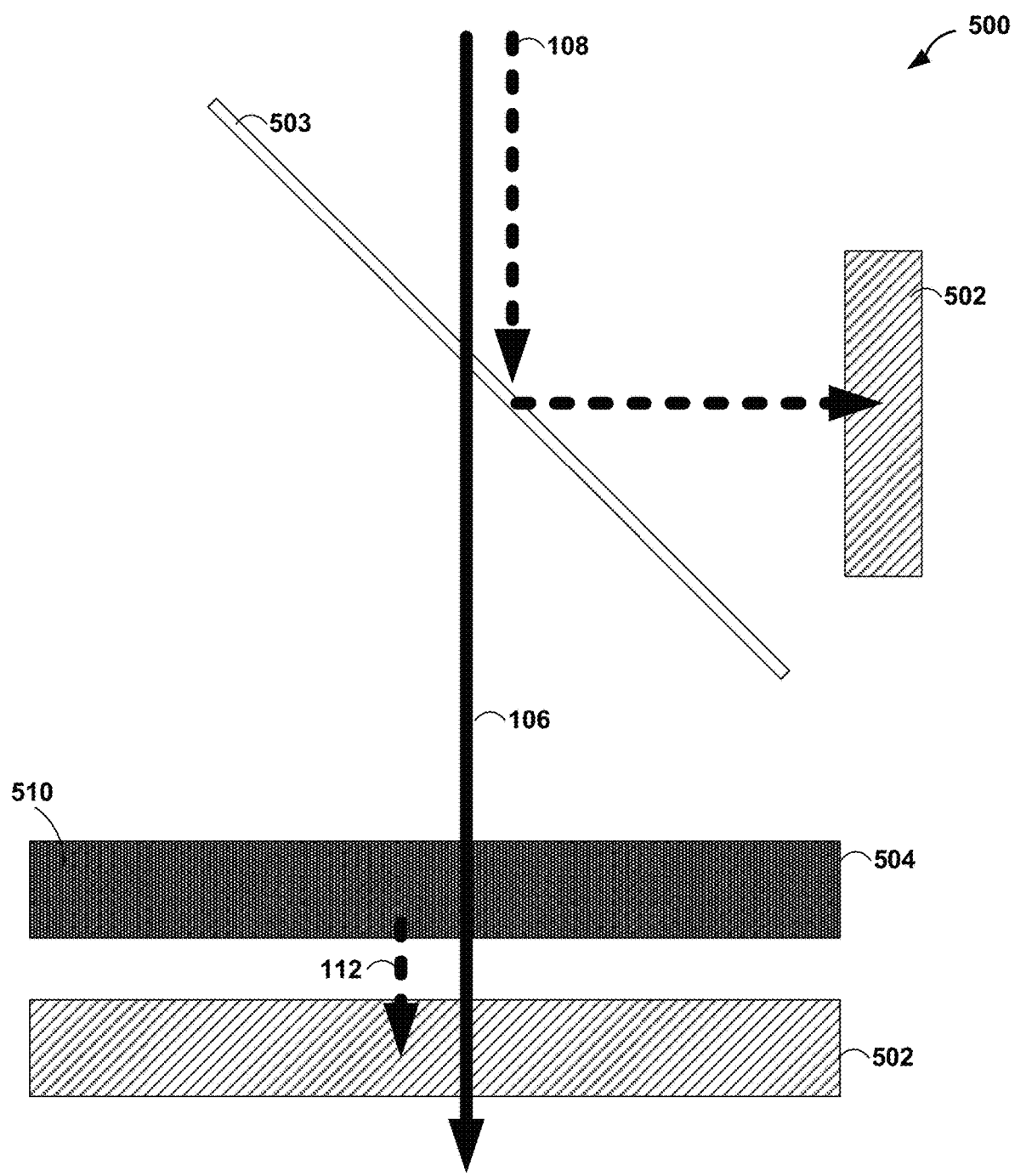
FIG. 7 is a cross-sectional block diagram illustrating an example sensor, in accordance with the techniques of the disclosure.

FIG. 7 is a cross-sectional block diagram illustrating an example sensor 500, in accordance with the techniques of the disclosure. Sensor 500 includes one or more photosensitive silicon substrates 102 (also referred to as "silicon substrates 102"), upconversion layer 504, and beam splitter 502. Silicon substrates 102 may be substantially similar to silicon substrate 102 and/or silicon substrate 402 described above. In the example shown, sensor 500 includes two silicon substrates 502, however, sensor 500 may include more or fewer silicon substrates 502. For example, sensor 500 may include a single silicon substrate and one or more light directors (not shown) configured to direction light 108 to be incident on silicon substrate 502 without being incident on, or transmitting through, upconversion layer 504.

Upconversion layer 504 may be substantially similar to upconversion layers 104, 204, or 404 described above, except that upconversion layer 504 may comprise crystals 510 dispersed substantially densely (e.g., as described above) within upconversion layer 504. Crystals 510 may be substantially similar to crystals 110, 210, and/or 410 described above.

Generally, sensor 500 is configured such that light 106 is upconverted by crystals 510, and light 108 does not interact with crystals 510 and/or upconversion layer 504. For example, upconversion layer 504 may be substantially opaque to light 108, and sensor 500 is configured to redirect light 108 to be incident on silicon substrate 102 without interacting with upconversion layer 504, e.g., from a different direction, or to be incident on a different silicon substrate 102 without interacting with upconversion layer 504, e.g., as shown in FIG. 7. Beam splitter 503 is configured to spectrally select between light 106 and light 108, e.g., to direct light 106 and light 108 in different directions and thereby spatially separate light 108 from light 106. In the example shown, beam splitter 503 is configured to transmit and/or pass light 106 without redirection, and to reflect light 108. In other examples, beam splitter 503 may be configured to transmit and/or pass light 108 without redirection and to reflect light 106. In the example shown, beam splitter 503 is at a 45 degree angle to reflect light 108 at a 90 degree angle. In other examples, beam splitter 503 may be positioned and oriented in any configuration suitable for separating light 106 and light 108 for detection.

FIG. 8 is a flow diagram of an example method of forming a sensor, in accordance with the techniques of the disclosure. The method is described with reference to sensor 400 of FIG. 6, however, the techniques of FIG. 8 may be utilized to make different sensors, such as sensor 100, 150, 200, 300, 500, 1500, and/or 1600.

A manufacturer may dispose an upconversion layer 404 on a surface of a photo-sensitive silicon substrate (802). For example, the manufacturer may sift, drop, and/or sprinkle a plurality of crystals 404 on a surface of silicon substrate 402 (not shown in FIG. 6) or another surface adjacent to a surface of silicon substrate 402, e.g., a surface of dielectric layer 430 (e.g., as shown in FIG. 6). The manufacturer may sparsely or densely disperse crystals 410 substantially uniformly over the surface area of silicon layer 402 or a surface adjacent to silicon substrate 402 (e.g., a surface of dielectric layer 430). In some examples, crystals 410 may be coated onto a surface of silicon layer 402 or a surface adjacent to silicon substrate 402 (e.g., a surface of dielectric layer 430) via a carrier, such as acetone, that may subsequently be removed (e.g., via evaporation). The manufacturer may disperse crystals 410 within the carrier, sparsely and/or densely, such that after coating, crystals 410 are sparsely or densely dispersed substantially uniformly over the surface area of silicon layer 402 or a surface adjacent to silicon substrate 402 (e.g., a surface of dielectric layer 430). In other examples, the manufacturer may disperse crystals 410 within a binder that retains crystals 410 adjacent to the surface area of silicon layer 402 or a surface adjacent to silicon substrate 402 (e.g., a surface of dielectric layer 430). The manufacturer may disperse crystals 410 sparsely or densely, and substantially uniformly within the volume of the binder, and the dispose the binder on the surface area of silicon layer 402 or a surface adjacent to silicon substrate 402 (e.g., a surface of dielectric layer 430), e.g., via coating, coating and curing, and/or laminating the binder.

In some examples, prior to disposing upconverting layer 404, the manufacturer may form crystals 410 via atomic layer deposition of aluminum oxide and/or hafnium oxide and dope the aluminum oxide and/or hafnium oxide with one or more dopants, e.g., rare earth elements, during or subsequent to atomic layer deposition. The manufacturer may then dispose and/or disperse the crystals on a surface, within a carrier, and/or within a binder as described above.

FIG. 9 is a flow diagram of an example method of detecting electromagnetic radiation, in accordance with the techniques of the disclosure. The method is described with reference to sensor 400 of FIG. 6, however, the techniques of FIG. 9 may be utilized with different sensors, such as sensor 100, 150, 200, 300, 500, 1500, and/or 1600.

A sensor 400 may convert light 106 having a first range of wavelengths greater than 1100 nm to light 112 having a second wavelength range less than or equal to 1100 nm (802). For example, sensor 400 may convert light 106 to light 112a and/or 112b via upconversion layer 404. The sensor 400 may then detect light 112 having the second range of wavelengths less than or equal to 1100 nm. For example, silicon substrate 402 may absorb, sense, and/or detect light 112a and/or 112b as illustrated in FIG. 6.

As discussed above, the cost of short wave infrared (SWIR) imagers may be high due to materials and processing, there is a need for low-cost SWIR imagers. Described herein are silicon CMOS and CCD or other imagers that can increase near IR quantum efficiency (QE) for increased night vision capability and extend silicon imager response to SWIR. The disclosed low cost SWIR imagers may be silicon imagers with a relatively low cost crystal layer applied such that it interacts with incoming photon and modifies wavelength and entry angle. The SWIR imaging disclosed includes 1500 nm LIDAR laser or laser designators, and provides for reducing dark current with a charging layer. As a result, NIR QE may be increased by increasing scatter, e.g., in the 800 nm to 1050 nm wavelength range. This may improve a recognition range for night vision cameras and goggles. Additionally, the SWIR response of example sensors disclosed herein may allow a silicon device to image in the wavelength range of eye safe layers used for target designation, communications, and LIDAR. Example sensors disclosed here may be a low-cost solution to SWIR imaging, e.g., relative to InGaAs detectors with a readout integrated circuit (IC) and an attached detector array. Furthermore, the addition of a crystal upconversion layer allow for negative or positive charge that provides an alternate way to stabilize back side illuminated silicon imagers. Crystals disclosed herein may also provide a negative charging layer to reduce dark current and increase blue QE.

For the disclosed crystal upconversion layer, the crystals may be applied in a light transmitting medium to the top or back side of silicon imagers such as CMOS or CCD. This may not require silicon processing and can be added after wafers are delivered from a silicon foundry. Applying these layers may not increase dark current, which is useful for low light level imaging. The addition of the upconverting layer may not increase system size weight or power. The described methods and configurations may reduce and/or eliminate the need for specialized silicon foundry processing. Aspects of the techniques herein may be done outside the foundry. This increases the number of foundries available to fabrication and reduces costs.

In some examples, depending on crystal implementation, certain useful features may be obtained. For example, scattering NIR photons entering an imager may extend the absorption path and the therefore increase NIR QE. This may be useful for nighttime imaging where the spectrum may be weighted toward the NIR spectrum. Further, the described crystal implementation may provide optical up-conversion so that, for example, the energy of two SWIR photons may be upconverted to a half wavelength NIR photon, which may generate hole-electron pairs in silicon allowing imaging. For example, eye safer SWIR laser output may be imaged, with an applied crystal upconversion layer, using silicon devices which are otherwise transparent to SWIR and may not directly image SWIR. Furthermore, the crystal upconversion layer may be designed to have a negative or positive stored charge. For example, a negative charge may be used to stabilize the light input silicon surface for a p-type substrate imager. In addition to having increased NIR QE for night vision, the crystal upconversion layer implementation for imagers described herein allow SWIR response to go beyond the long wave cut off for silicon and provides for negative surface charge which simplifies stabilizing backside surface passivation. For example, an atomic layer deposition (ALD) of $Al_2O_3$ and $HFO_2$ may be used to passivate a light input surface for BSI imagers and solar cells. An ALD layer may be used for back surface passivation to reduce dark current and increase blue-green quantum efficiency.

Non-limiting example applications for crystal layers applied to silicon imagers are disclosed. These may include scattering photon angle at detector photon input to increase NIR QE, optical up-conversion to allow SWIR wavelengths such as typical LIDAR wavelengths, e.g., 1500 nm, to be detected using silicon imagers, and providing a negative charge to stabilize silicon detectors.

Furthermore, the disclosed approach may be applicable to top side illumination (TSI) and back side illuminated (BSI) CMOS and CCD imaging arrays. The application of the crystal layer may be done after silicon foundry steps are completed. The completed device may be monolithic in that detector bumping may be not required as may be for other approaches.

Scattering the angle of light at the silicon surface may provide an increased path for NIR absorption in silicon detectors. Crystal size and composition may be chosen to scatter photon angles in the wavelength range of 800 nm to 1050 nm to increase photon absorption in this NIR wavelength range. This NIR wavelength range may be important for nighttime imaging due to the NIR components of the night sky illumination spectrum. To accomplish this, a detector (e.g., a conventional silicon-based sensor) may need to be at least 20 micrometers thick, which may lead to reduced modulation transfer function (MTF) resulting in loss of image detail. In some cases, a thick detector epitaxial layer leads to fabrication complications. Deep trench isolation may be used around each detector to reduce the impact of scatter induced MTF reduction.

Figure 10:
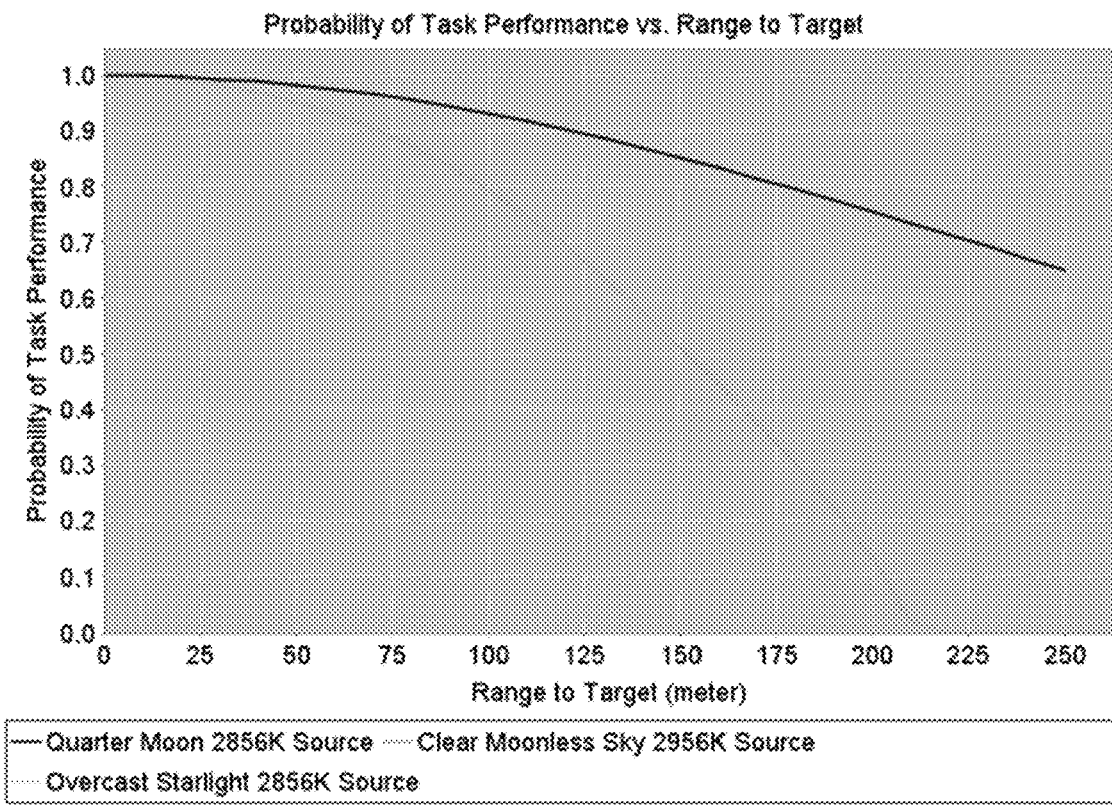
FIG. 10 is a plot of example probabilities of performing a task with range distance at a variety of low visible light levels for a silicon sensor without surface scattering.
Figure 11:
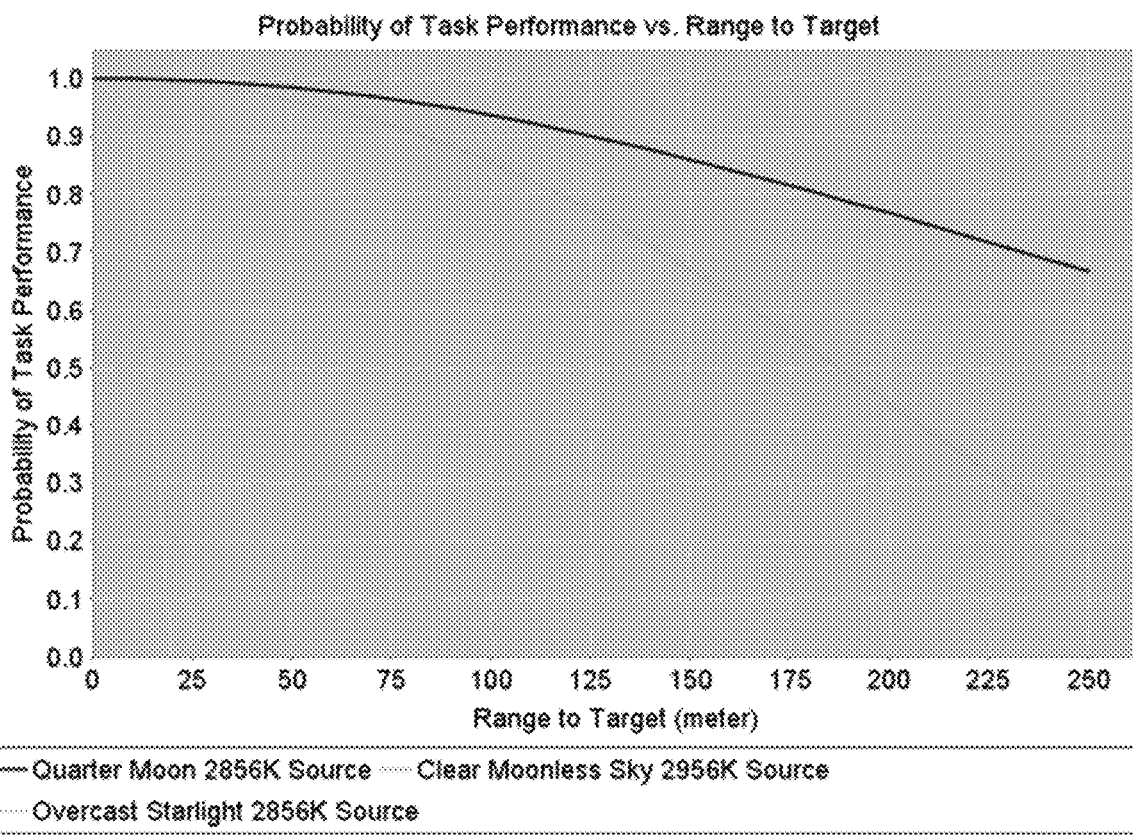
FIG. 11 is a plot of example probabilities of performing a task with range distance at a variety of low visible light levels for a silicon sensor with surface scattering.

For night vision imaging, high NIR quantum efficiency (QE) and high MTF may be needed for increasing the recognition range. FIG. 10 shows an example of detection probability for a standard imager without photon scattering. FIG. 11 shows increased probability of detection when photon scattering is used for the same silicon detector having reflective deep trench isolation. With clear starlight illumination, the probability of target detection increased from 10% to 45%.

Figure 12:
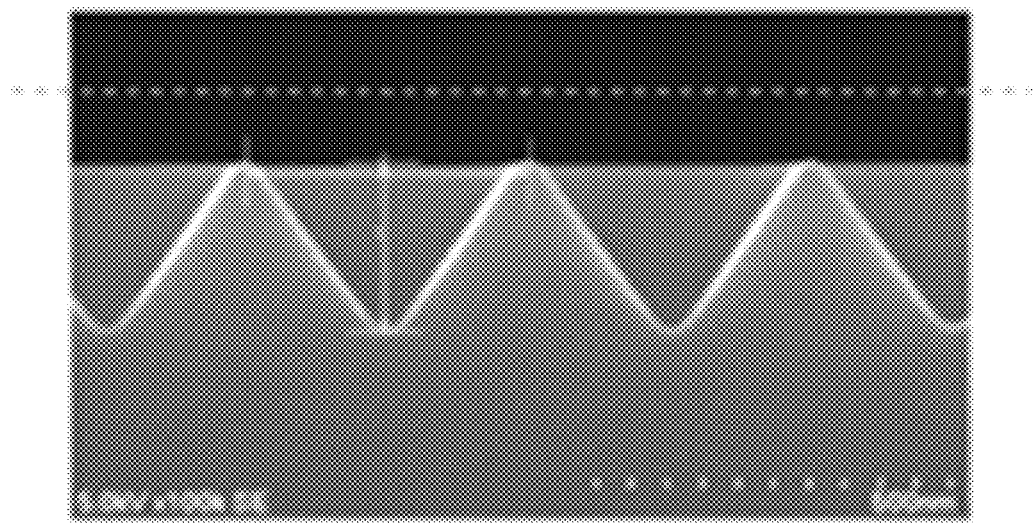
FIG. 12 is a scanning electron microscope (SEM) image illustrating an inverse pyramid array etched in silicon.
Figure 13:
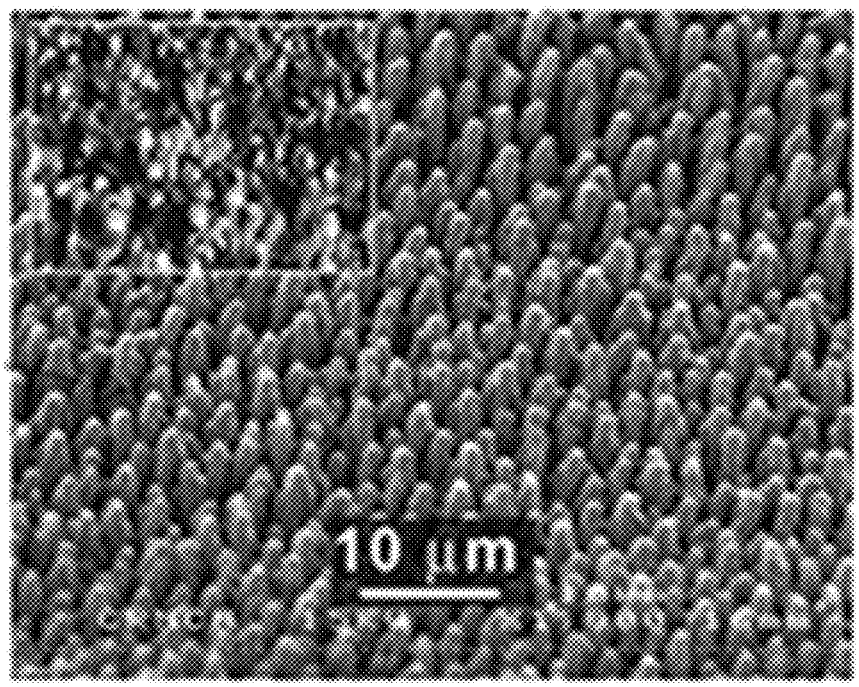
FIG. 13 is a scanning electron microscope (SEM) image illustrating a silicon surface after a black silicon process.
Figure 14:
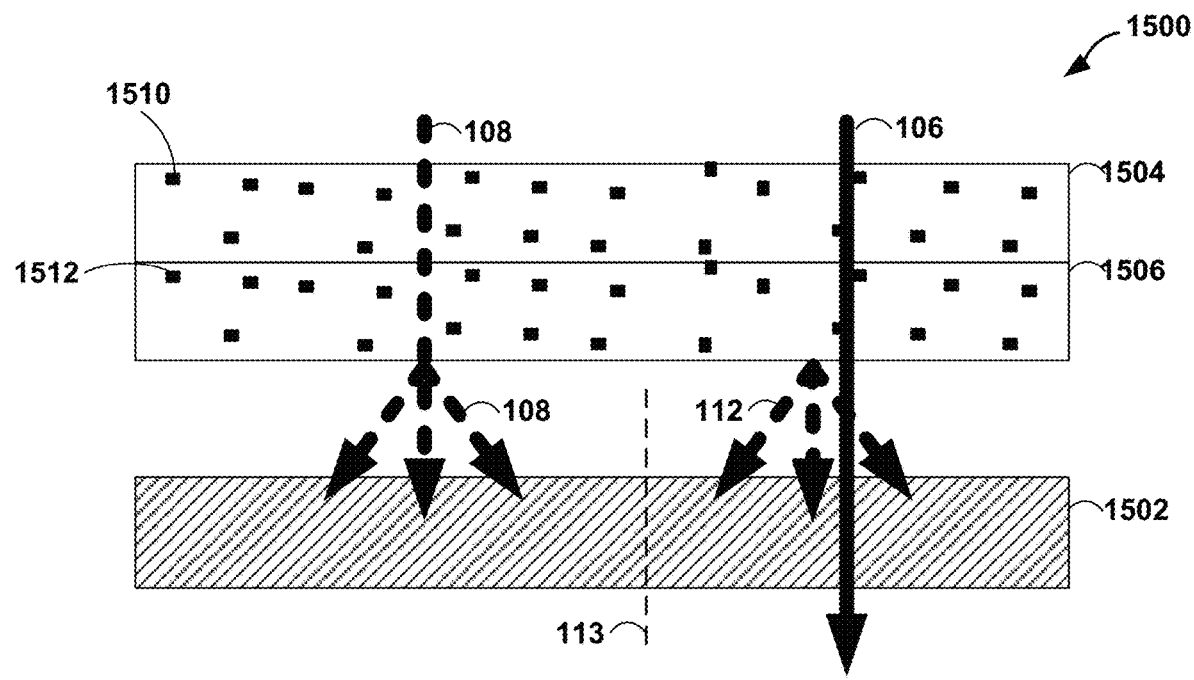
FIG. 14 is a cross-sectional block diagram illustrating an example sensor, in accordance with the techniques of the disclosure.

Methods of achieving scattering using backside silicon processing may include etched inverted pyramids and using black silicon. These approaches may increase the photon path by modifying the silicon surface. Imagers fabricated this way may require using a foundry capable of the process. Dark current may be increased which raises the noise floor. FIG. 12 shows an inverse pyramid array etched in silicon. FIG. 13 show the silicon surface after black silicon process. FIG. 14 is a cross-sectional block diagram illustrating an example sensor 1500, in accordance with the techniques of the disclosure. FIG. 14 shows an example embodiment of a crystal scattering stack including upconversion layers 1504 and 1506 which may be substantially similar to upconversion layer 104, on silicon substrate 1502, which may be substantially similar to upconversion layer 104. In the example shown, upconversion layers 1504 and 1506 each include a plurality of crystals 1510 and 1512, respectively, which may be substantially similar to crystals 110. In some examples, the crystal type, size, and/or disbursement of crystals 1510 and 1512 may be the same as each other, or different from each other. In some examples, one or both of crystals 1510 and 1512 are configured to scatter light 108 incident onto the photo-sensitive silicon substrate to increase an incidence angle, relative to the surface normal of the photo-sensitive silicon substrate, of at least a portion of the electromagnetic radiation comprising the second range of wavelengths. In this case the silicon detector may be not modified (in order to e.g., to accommodate the upconverions layers 1 and 2), and the process may be implemented outside a foundry.

Figure 15:
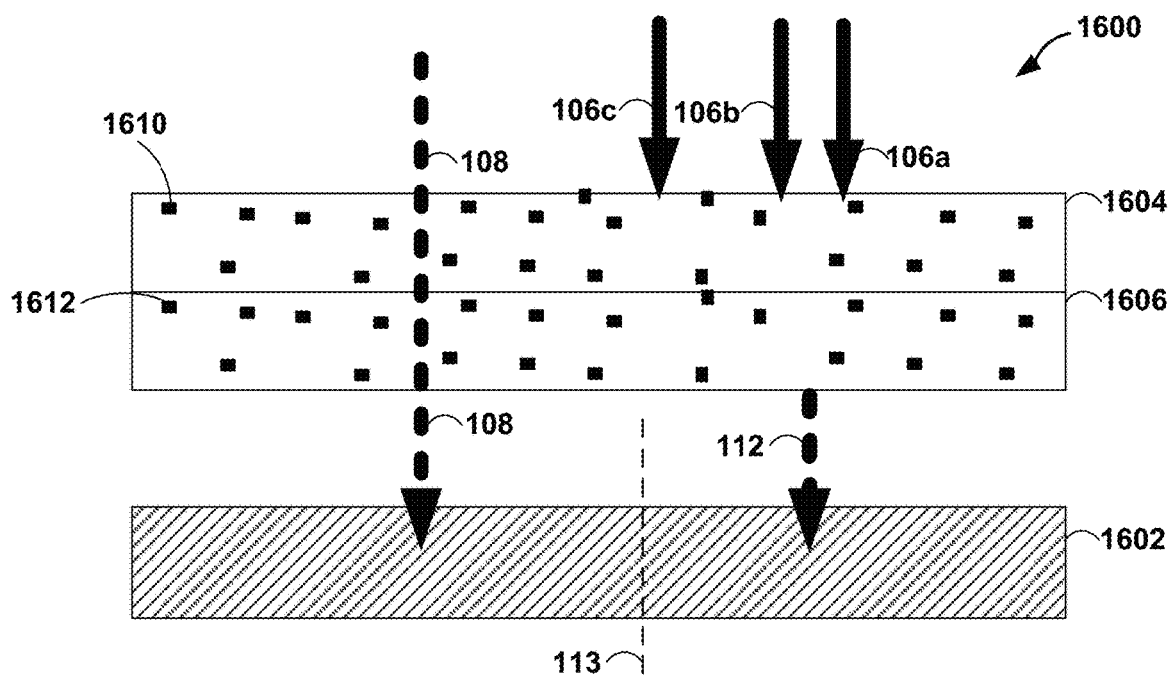
FIG. 15 is a cross-sectional block diagram illustrating an example sensor, in accordance with the techniques of the disclosure.

Crystals may be designed to upconvert photon energy and therefore decrease wavelength. For example, two photons may be absorbed and emitted as a single photon having shorter wavelength. In the example shown in FIG. 5, a surface coating containing upconverting crystals, e.g., one or more upconversions layers, may be used to move wavelengths in the SWIR range (e.g., which are not otherwise detectable by silicon) into the NIR range which may be detectable by silicon. In some examples, upconversion efficiency may be low, e.g., less than 1%, but the process may be useful for relatively bright SWIR sources such as is used for laser designators and fiberoptic systems. This approach may make standard CMOS or CCD imagers useful for imaging laser designators or measure beam distribution for eye safe lasers. For typical 1550 nm LIDAR wavelengths and up, the converted output would be in the NIR silicon detection range. For the case of laser designator imaging, the upconverted SWIR output could be overlaid on a color or grayscale image from a detector without an upconversion layer and having a lens operable in the visible to NIR range. The general approach may be shown in FIG. 15 for an idealized case without QE loss. FIG. 15 is a cross-sectional block diagram illustrating an example sensor 1600, in accordance with the techniques of the disclosure. In the example shown, sensor 1600 includes upconversion layers 1604 and 1606 which may be substantially similar to upconversion layer 104, on silicon substrate 1602, which may be substantially similar to upconversion layer 104. In the example shown, upconversion layers 1604 and 1606 each include a plurality of crystals 1610 and 1612, respectively, which may be substantially similar to crystals 110. In some examples, the crystal type, size, dopant, and/or disbursement of crystals 1610 and 1612 may be the same as each other, or different from each other. In some examples, one or both of crystals 1610 and 1612 are configured convert light 106 to light 112. In some examples, crystals 1610 and/or 1612 may upconvert light 106 via absorption of light 106 (e.g., by the dopant) and emission of light 112 via fluorescence of light at energies (e.g., wavelengths) determined by the dopant material. In some examples, crystals 1610 and/or 1612 may upconvert lower energy light 106 to higher energy light 112 corresponding to integer numbers, or very nearly integer numbers, of quanta of electromagnetic energy, e.g., photons. In the example shown, crystals 1610 and/or 1612 may be configured to upconvert two, three, four, or more photons of light 106 to one or more photons of light 112. For example, crystals 1610 and/or 1612 may be configured to upconvert three photons of light 106 (e.g., 106*a*, 106*b*, and 106*c*) at about 1550 nm to a single photon of light 112 at about 520 nm.

For BSI sensors, the back silicon surface may need to be stabilized. This may include back side pinning to reduce dark current and produce a sharp gradient electric field to prevent electron hole recombination. This may be done several ways using silicon processing. Silicon process may use backside implant and furnace, or laser anneal to activate the implant in the crystal lattice. Alternately, an external layer may be used which has a permanent electric charge. For n-channel, p-substrate imagers, a negative charge may be used. This may be achieved with Atomic Layer Deposition (ADS) of aluminum oxide or hafnium oxide. Alternatively, in accordance with the techniques disclosed herein, crystals (e.g., crystals 110, 210, 410, and/or 510) having a negative charge may be used. This may be combined with scatter and up conversion for the backside process.

In some examples, the structure illustrated in FIG. 6 provides sensitivity to VIS/NIR photons equal to known back side illuminated pixels used, for example, for night vision. In addition, SWIR response may be achieved using upconversion layer 404 including crystals 410 (e.g., also referred to as upconverting crystals (UPNC)) capable of emitting photons with an energy that may be absorbed in silicon to generate hole electron pairs. The signal electrons may be collected by the photo diode and may be read out as a useful signal. The emitted spectrum for a UPNC layer containing Ytterbium (Yb) and Erbium (Er) atoms is shown in FIG. 5. In this example 1550 nm laser energy stimulates upconversion layer 404 to emit mainly green photons having a 540 nm wavelength which may be absorbed by silicon and generate an electron signal.

Returning to FIG. 6, VIS/NIR photons may be mostly absorbed in the p-type epitaxial layer 422 and n-type photodiode 424, while SWIR photos may not be absorbed in the silicon layers and reach upconversion layer 404 with virtually no attenuation. The top side layer of UPNC generates VIS/NIR photons at a wavelength dependent on the rare earth atoms used to form the UPNC. Having upconversion layer 404 may not impact normal VIS/NIR low light level performance.

FIG. 5 shows the UPNC layer emission spectrum when an electron is released from the 5f Ytterbium (Yb) shell and jumps to an Erbium (Er) atom 4th shell. The process may be excited by SWIR photon energy. Most emitted photons are absorbed in p-type epitaxial layer 422 and n-type photodiode 424 (FIG. 6) where electron hole pairs are generated. UCNP photon emission may be isotropic so reflector 450 over transparent layer 450 may be used to redirect outward going photons back into the silicon substrate 402 layer to improve quantum efficiency (QE). The thickness of transparent layer 450 may be adjusted to improve and/or maximize SWIR to electron conversion. The reflector 450 also reflects SWIR photons back into upconversion layer 404 to produce photons capable of generating hole electron pairs in silicon substrate 402. These photons are absorbed in p-type epitaxial layer 422 and n-type photodiode 424 to further improve SWIR to electron conversion. Sensor 400 may be used to form a 2-dimensional CMOS pixel array with low light level capability equal to an unmodified BSI imager while also responding to SWIR photons at, for example, a wavelength of 1550 nm for laser detection.

A sensor array using sensors disclosed herein may be useful for threat detection and identification of eye safe and non-eye safe laser designators overlaid on a scene image showing the field of view. The BSI VIS/NIR image may be able to provide night vision while allowing the user to see laser designators on a remote target as well as to locate a SWIR laser if the user may be being designated.

The foregoing system and embodiments thereof have been provided in sufficient detail, but it may be not the intention of the applicant(s) for the disclosed system and embodiments provided herein to be limiting. Additional adaptations and/or modifications are possible, and, in broader aspects, these adaptations and/or modifications are also encompassed. Accordingly, departures may be made from the foregoing system and embodiments without departing from the spirit of the system.

What is claimed is:

1. A sensor comprising:
an upconversion layer comprising a plurality of crystals configured to convert electromagnetic radiation comprising a first range of wavelengths greater than 1100 nm to electromagnetic radiation comprising a second range of wavelengths less than or equal to 1100 nm; and
a photo-sensitive silicon substrate configured to detect the electromagnetic radiation comprising the second range of wavelengths,
wherein the plurality of crystals are configured to scatter the electromagnetic radiation comprising the second range of wavelengths incident onto the photo-sensitive silicon substrate to increase an incidence angle, relative to a surface normal of the photo-sensitive silicon substrate, of at least a portion of the electromagnetic radiation comprising the second range of wavelengths.

2. The sensor of claim 1, wherein the plurality of crystals comprise a dopant configured to absorb the electromagnetic radiation comprising the first range of wavelengths and emit the electromagnetic radiation comprising the second range of wavelengths.

3. The sensor of claim 2, wherein the dopant comprises a rare earth element.

4. The sensor of claim 1, wherein the plurality of crystals comprise a range of crystal sizes greater than or equal to 0.1 micrometers and less than or equal to 100 micrometers.

5. The sensor of claim 1,
wherein the upconversion layer comprising the plurality of crystals is overlying the photo-sensitive silicon substrate, and
wherein the upconversion layer is configured to transmit at least a portion of the electromagnetic radiation comprising the second range of wavelengths to be incident on the photo-sensitive silicon substrate.

6. The sensor of claim 5, wherein the plurality of crystals are substantially opaque to the electromagnetic radiation comprising the second range of wavelengths, and
wherein at least a portion of the plurality of crystals are dispersed within the upconversion layer to have a gap between adjacent crystals that extends through a thickness of the upconversion layer such that the upconversion layer is configured to transmit at least a portion of the electromagnetic radiation comprising the second range of wavelengths.

7. The sensor of claim 1, wherein the upconversion layer is a first upconversion layer, wherein the plurality of crystals are a first plurality of crystals, wherein the photo-sensitive silicon substrate is a first photo-sensitive silicon substrate, the sensor further comprising:
a second upconversion layer comprising a second plurality of crystals configured to convert electromagnetic radiation comprising a third range of wavelengths greater than 1100 nm to electromagnetic radiation comprising the second range of wavelengths less than or equal to 1100 nm, wherein the third range of wavelengths comprises at least one wavelength different from the first range of wavelengths; and
a second photo-sensitive silicon substrate configured to detect the electromagnetic radiation comprising the second range of wavelengths.

8. A method of making a sensor, the method comprising:
disposing an upconversion layer on a surface of a photo-sensitive silicon substrate,
wherein the upconversion layer comprises a plurality of crystals, wherein the plurality of crystals are configured to convert electromagnetic radiation comprising a first range of wavelengths greater than 1100 nm to electromagnetic radiation comprising a second range of wavelengths less than or equal to 1100 nm, and
wherein the photo-sensitive silicon substrate is configured to detect the electromagnetic radiation comprising the second range of wavelengths,
wherein the plurality of crystals are configured to scatter the electromagnetic radiation comprising the second range of wavelengths incident onto the photo-sensitive silicon substrate to increase an incidence angle, relative to a surface normal of the photo-sensitive silicon substrate, of at least a portion of the electromagnetic radiation comprising the second range of wavelengths.

9. The method of claim 8, wherein the plurality of crystals comprise a dopant configured to absorb the electromagnetic radiation comprising the first range of wavelengths and emit the electromagnetic radiation comprising the second range of wavelengths.

10. The method of claim 9, wherein the dopant comprises a rare earth element.

11. The method of claim 8, wherein the plurality of crystals each has a crystal size greater than or equal to 0.1 micrometer and less than or equal to 100 micrometers.

12. The method of claim 8, wherein disposing the upconversion layer on the surface of the photo-sensitive silicon substrate comprises disposing the upconversion to overlie the photo-sensitive silicon substrate, and wherein the upconversion layer is configured to transmit at least a portion of the electromagnetic radiation comprising the second range of wavelengths to be incident on the photo-sensitive silicon substrate.

13. The method of claim 8, wherein disposing the upconversion layer on the surface of the photo-sensitive silicon substrate comprises disposing the upconversion to underlie the photo-sensitive silicon substrate.

14. The method of claim 13, further comprising disposing a reflector to underlie the upconversion layer comprising a plurality of crystals, wherein the reflector is configured to reflect at least one of the electromagnetic radiation comprising the second range of wavelengths or electromagnetic radiation comprising the first range of wavelengths.

15. The method of claim 13, wherein the photo-sensitive silicon substrate is configured to substantially transmit the electromagnetic radiation comprising the second range of wavelengths.

16. A method of detecting electromagnetic radiation, the method comprising:
converting, by an upconversion layer of a sensor, the upconversion layer comprising a plurality of crystals, electromagnetic radiation comprising a first range of wavelengths greater than 1100 nm to electromagnetic radiation comprising a second range of wavelengths less than or equal to 1100 nm;
scattering, by the plurality of crystals, the electromagnetic radiation comprising the second range of wavelengths incident onto a photo-sensitive silicon substrate of the sensor to increase an incidence angle, relative to a surface normal of the photo-sensitive silicon substrate, of at least a portion of the electromagnetic radiation comprising the second range of wavelengths; and
detecting, by the photo-sensitive silicon substrate of the sensor, the electromagnetic radiation comprising the second range of wavelengths.

17. A sensor comprising:
an upconversion layer comprising a plurality of crystals configured to convert electromagnetic radiation comprising a first range of wavelengths greater than 1100 nm to electromagnetic radiation comprising a second range of wavelengths less than or equal to 1100 nm; and
a photo-sensitive silicon substrate configured to detect the electromagnetic radiation comprising the second range of wavelengths,
wherein the upconversion layer comprising the plurality of crystals is underlying the photo-sensitive silicon substrate.

18. The sensor of claim 17, further comprising a reflector underlying the upconversion layer comprising a plurality of crystals, wherein the reflector is configured to reflect at least one of the electromagnetic radiation comprising the second range of wavelengths or the electromagnetic radiation comprising the first range of wavelengths.

19. The sensor of claim 17, wherein at least a portion of the plurality of crystals are dispersed within the upconversion layer such that there are no gaps between adjacent crystals that extend through a thickness of the upconversion layer.

20. The sensor of claim 17, wherein the photo-sensitive silicon substrate is configured to substantially transmit the electromagnetic radiation comprising the first range of wavelengths.

* * * * *